(12) United States Patent
Ching et al.

(10) Patent No.: US 11,355,396 B2
(45) Date of Patent: Jun. 7, 2022

(54) METHOD OF FORMING A SEMICONDUCTOR STRUCTURE INCLUDING LATERALLY ETCHING SEMICONDUCTOR MATERIAL IN FIN RECESS REGION AND DEPOSITING METAL GATE THEREIN

(71) Applicant: Taiwan Semiconductor Manufacturing Company, Ltd., Hsinchu (TW)

(72) Inventors: Kuo-Cheng Ching, Zhubei (TW); Zhi-Chang Lin, Zhubei (TW); Shi Ning Ju, Hsinchu (TW); Chih-Hao Wang, Baoshan Township (TW); Kuan-Ting Pan, Taipei (TW)

(73) Assignee: Taiwan Semiconductor Manufacturing Company, Ltd, Hsinchu (TW)

( * ) Notice: Subject to any disclaimer, the term of this patent is extended or adjusted under 35 U.S.C. 154(b) by 271 days.

(21) Appl. No.: 16/527,948

(22) Filed: Jul. 31, 2019

(65) Prior Publication Data
US 2021/0035865 A1    Feb. 4, 2021

(51) Int. Cl.
*H01L 21/8234*    (2006.01)
*H01L 27/088*    (2006.01)

(52) U.S. Cl.
CPC ........... *H01L 21/823431* (2013.01); *H01L 21/823418* (2013.01); *H01L 21/823481* (2013.01); *H01L 27/0886* (2013.01)

(58) Field of Classification Search
CPC ..... H01L 21/823431; H01L 21/823418; H01L 21/823481; H01L 27/0886
USPC ........................................................ 257/401
See application file for complete search history.

(56) References Cited

U.S. PATENT DOCUMENTS

| 2015/0028426 A1* | 1/2015 | Ching | H01L 29/785 257/401 |
| 2020/0006491 A1* | 1/2020 | Bomberger | H01L 29/66795 |
| 2020/0312841 A1* | 10/2020 | Rachmady | H01L 21/823412 |

* cited by examiner

*Primary Examiner* — Matthew E. Gordon
(74) *Attorney, Agent, or Firm* — Finnegan, Henderson, Farabow, Garrett & Dunner L.L.P

(57) ABSTRACT

The present disclosure provides a method of forming a semiconductor structure with a metal gate. The semiconductor structure is formed by first fabricating fins over a semiconductor substrate, followed by a formation of a source and a drain recess. A source and a drain region may then be deposited into the source and the drain recess. The gate structure may be deposited into the region between the fins. The gate structure includes dielectric and metallic layers. In the regions between the fins, the gate structure is isolated from the source and the drain region by an insulating layer.

20 Claims, 37 Drawing Sheets

Front View

Back View

R-View

R-View

R-View

R-View

R-View

R-View

G-View

G-View

METHOD OF FORMING A SEMICONDUCTOR STRUCTURE INCLUDING LATERALLY ETCHING SEMICONDUCTOR MATERIAL IN FIN RECESS REGION AND DEPOSITING METAL GATE THEREIN

BACKGROUND

One of the goals of the semiconductor industry is to continue shrinking the size and increasing the speed of individual Field Effect Transistors (FETs). To achieve these goals, Fin Field-Effect Transistors (FinFETs) have been developed. The FinFET is a variation on traditional Metal-Oxide-Semiconductor Field-Effect Transistors (MOSFET) and includes a nonplanar, double-gate transistor built on silicon or a silicon-on-insulator (SOI) substrate. FinFETs are distinguished from MOSFETs by the presence of a thin silicon "fin" inversion channel on top of the substrate, allowing the gate to make contact on the left and right sides of the fin.

Further miniaturization of transistors presents various challenges in FinFET fabrication and design. For example, when fabricating FinFETs, device performance can be improved by using a metal gate structure instead of a typically polysilicon gate electrode. One process of forming a metal gate structure is termed a replacement-gate or "gate-last" process in which the final gate structure is fabricated "last" which allows for reduced number of subsequent processes, including high-temperature processing, that is performed after formation of the gate. However, there are challenges to implementing such fabrication processes, especially with scaled down device features and complex surface topology. One challenge is the formation of a metal gate structure between closely spaced fins.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
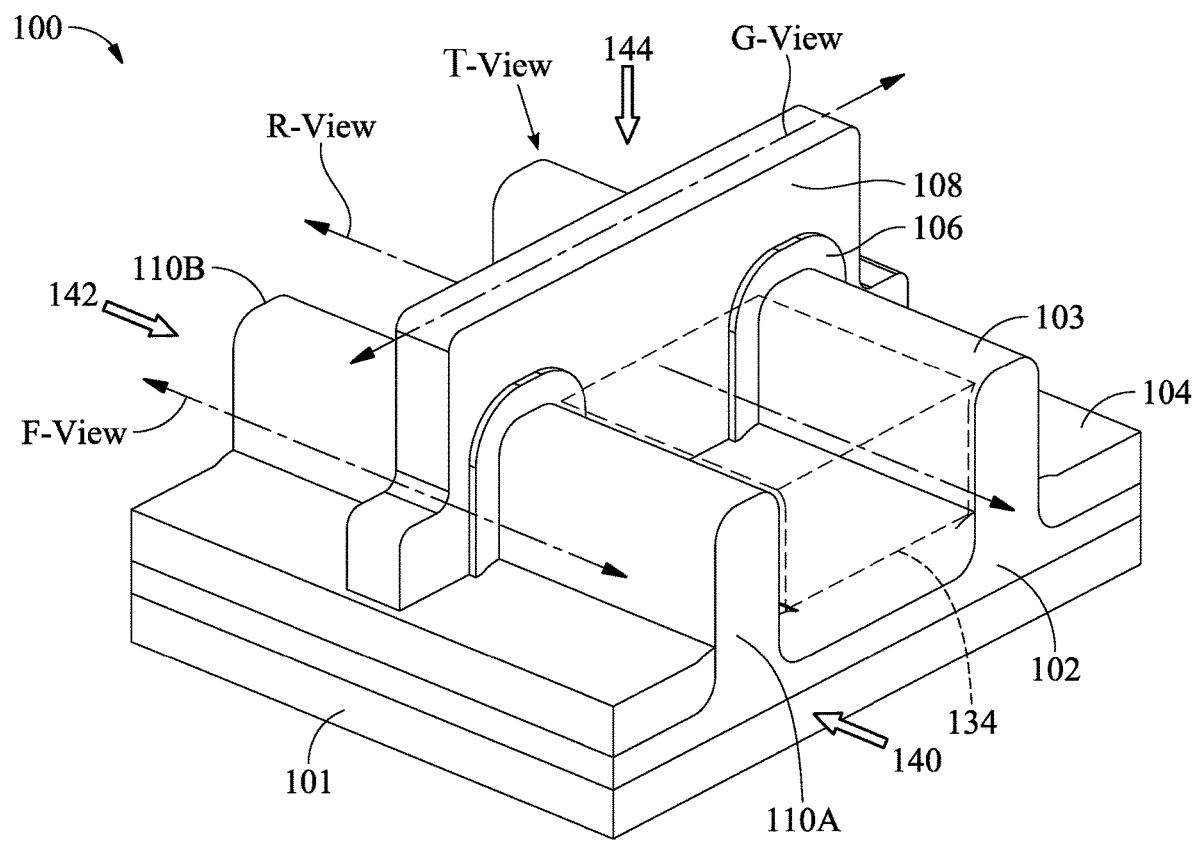
FIG. 1A is a three-dimensional view of an illustrative semiconductor structure that can be used to form a FinFET device, consistent with various illustrative embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "over", "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, unless otherwise noted, the term "in proximity", "close to" "proximate" and the like, when comparing distance between two regions within a semiconductor structure, the semiconductor structure extending laterally and vertically through a characteristic length, width and height, implies that the regions are at most ten percent of either the characteristic length, the characteristic width, or the characteristic height apart. The term "characteristic length" is a largest lengthwise dimension of the semiconductor structure, the term "characteristic width" is the largest widthwise dimension of the semiconductor structure, and the term "characteristic height" is the largest heightwise dimension of the semiconductor structure. The term "in proximity," "close to," "proximate" and the like, when comparing regions within a semiconductor structure may also refer to adjacent regions (e.g., regions in contact with one another, or spaced apart from one another). As used herein, unless otherwise noted, the term "remote," implies that regions are not adjacent to each other.

As used herein, unless otherwise noted, the term "thickness" for a layer that may include variable thickness, implies the smallest thickness of the layer as measured throughout the layer.

As used herein, unless otherwise noted, the term "greater," "higher," "larger," "above" and the like, when comparing two values, the first value being greater than the second value, implies that the first value is at least one percent greater than the second value. Similarly, unless otherwise noted, the term "less," "lower," "smaller" and the like, when comparing two values, the first value being less than the second value, implies that the first value is at least one percent smaller than the second value. As used herein, unless otherwise noted, the term "comparable," "similar" and the like, when comparing two values, implies that one value is in the range of 10 to 1000 percent of another value.

Further, as used herein, unless otherwise noted, the term "set" means one or more (i.e., at least one) and the phrase "any solution" means any now known or later developed solution. Furthermore, as used herein, unless otherwise noted, the term "substantially the same," when comparing a first set of values with the second set of values, implies that values in the first set of values are at most 10 percent different from the values in the second set of values. Further, the term "substantially the same," when comparing materials forming regions, implies that materials within regions are the same apart from unintended variations resulted from variation in fabrication techniques used to form the regions.

Further, as used herein, unless otherwise noted, the term "parallel" when comparing two surfaces implies, that on average, two surfaces are oriented parallel to each other, wherein "on average" implies that first normal directed perpendicular to a first surface, at any point on the surface, and second normal directed perpendicular to a second surface, at any point on the surface, may be collinear with at most 10 degrees of difference from perfect collinearity. As used herein, unless otherwise noted, the term "nonparallel" when comparing two surfaces implies that the surfaces are not parallel as defined above.

Various embodiments generally relate to semiconductor devices, and more particularly to semiconductor devices utilizing gates. For example, the semiconductor device may include a FinFET device and may include a plurality of fins formed in a wafer and a gate covering a portion of the fins. The portion of the fins covered by the gate may serve as a channel region of the device. Portions of the fins may also extend out from under the gate and may be a part of source and drain regions of the device.

A semiconductor structure that can be used for fabricating FinFETs and methods of forming the same are provided in accordance with various embodiments. Also, some embodiments contemplate aspects used in planar devices, such as planar FETs and other embodiments contemplate aspects used in gate all-around (GAA) devices, such as GAA FETs. Intermediate stages of forming the semiconductor structure are illustrated. Some embodiments discussed herein are discussed in the context of FETs formed using a gate-last process. One of ordinary skill in the art will readily understand other modifications that may be made that are contemplated within the scope of the present disclosure. Although method embodiments are discussed according to a particular ordering of steps, various other method embodiments may be performed having steps in any logical order and may include fewer or more steps described herein.

In various embodiments, a semiconductor structure may include a substrate, a gate region, and various dielectric layers. FIG. 1A illustrates an example of a perspective view of a semiconductor structure 100 that may be used to form a semiconductor device, such as a FinFET. The semiconductor structure 100 may include a substrate 102, a buried insulating layer 101, and a plurality of fins 103 formed over substrate 102. Fins 103 may be separated by a fin recess region 134. Fin recess region 134 may describe a plurality of several recess regions located between various fins 103. The structure 100 may include isolation region 104, with fins 103 protruding above isolation region 104. Isolation region 104 may describe a plurality of several regions located between various fins 103. A gate dielectric layer 106 may be deposited along sidewalls and over a top surface of fins 103. A gate structure 108 formed of conductive material may be deposited over a first portion of the substrate 102 and over the gate dielectric layer 106, and source/drain regions 110A and 110B may be disposed on opposite sides of fins 103 with respect to the gate dielectric layer 106 and gate structure 108.

For purposes of this disclosure, structure 100 may be described relative to a front portion 140 of the structure, and a back side 142 of the structure, as well as a top portion 144 of structure 100. In many cases, various elements in front portion 140 of structure 100 may be the same or similar to related elements in the back portion of structure 100, and for such cases, only elements in front portion 140 of structure 100 will be shown, with understanding, that the same or similar elements are present in the back portion of the structure. When it is necessary to differentiate between an element in the front portion and a related element in the back portion of structure 100, the element in the front portion is be denoted by a numeral and a subscript "A" (e.g. 15A, etc.) while the element in the back portion is denoted by the same numeral and a subscript "B" (e.g., 15B, etc.). When those elements are referred to generically, or when there is no need to differentiate between the element from the front and back portion of structure 100 the element (which may only be depicted in front portion 140 of structure 100) may be merely referred by the numeral (e.g., 15, etc.). For example, source/drain regions in FIG. 1A are denoted by 110A and 110B but can also be denoted by 110 when referred to generically or when there is no need to differentiate between the element from the front and back portion of structure 100. The specific number of components depicted in the figures and the cross-section orientation was chosen to best illustrate the various embodiments described herein.

Various elements described in subsequent figures may include layers and regions containing material. These elements are denoted by a numeral or by a numeral and a subscript. In various embodiments, materials forming such elements may be referred to by the same numerals or by the same numerals and subscripts that are used to refer to elements formed from such materials. In some cases, when necessary, materials forming elements may be denoted by different numerals (or numerals and subscripts) than numerals (or numerals and subscripts) that are used to denote respective elements. In various embodiments, elements may include regions containing cavities (e.g., recesses, trenches, openings, etc.).

FIG. 1A further illustrates cross-sectional views that are used in later figures. A cross-sectional view "G-view" is across a channel, gate dielectric layer 106, and gate structure 108 of the structure 100. Such cross-sectional view is referred to as a G-view in the description of related subsequent figures. A cross-sectional view "F-view" is perpendicular to G-view and is along a longitudinal axis of one of the fins 103 and in the direction of, for example, a current flow between the source/drain regions 110A and 110B. Such cross-sectional view is referred to as an F-view in the description of related subsequent figures. A cross-sectional view "R-view" is parallel to F-view and is drawn through fin recess region 134. Such a cross-sectional view is referred to as an R-view in the description of related subsequent figures. Subsequent figures refer to these reference cross-sectional views for clarity. When necessary, the planes of cross-sectional views are indicated on some of the subsequent figures.

Figure 1B:
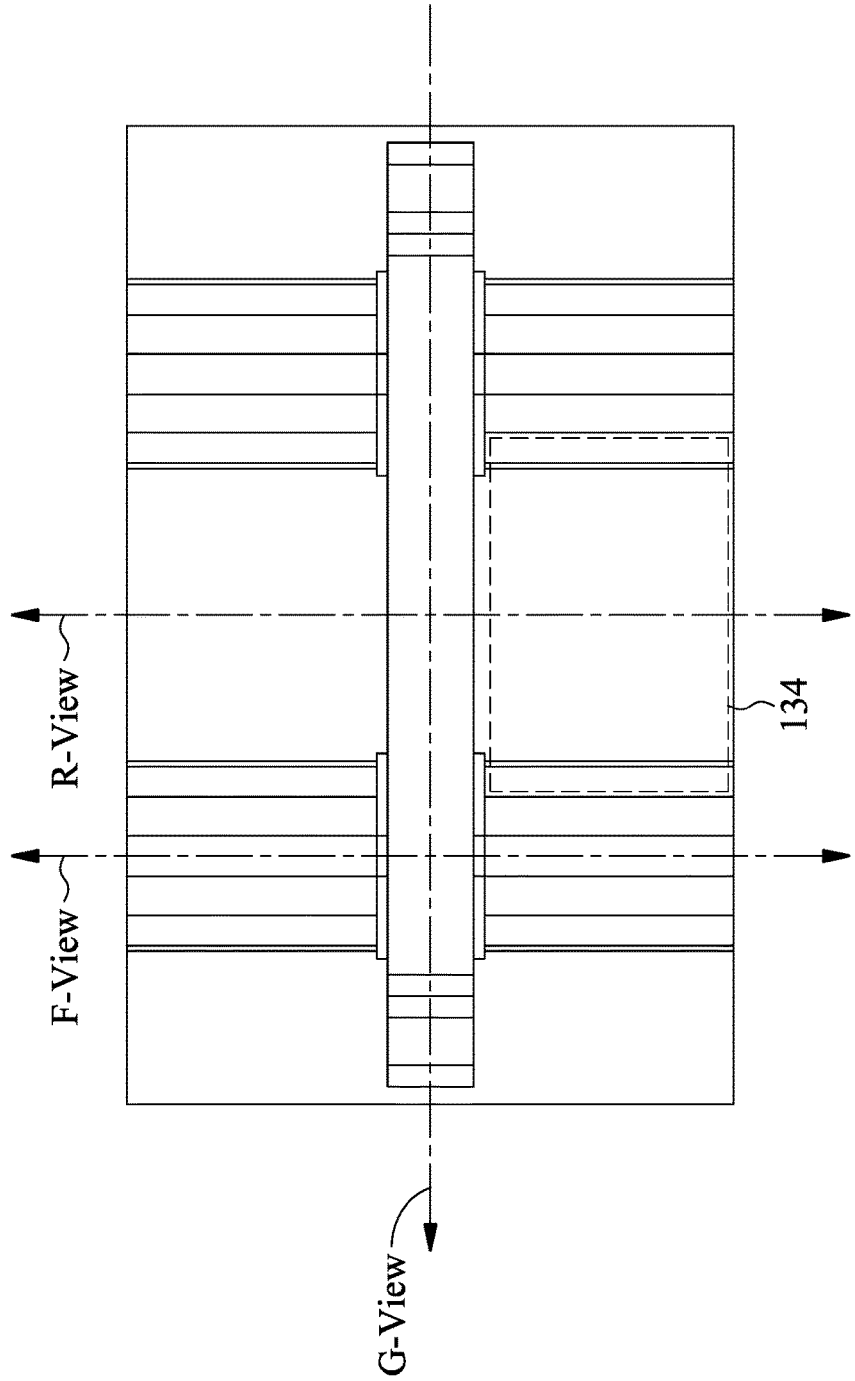
FIG. 1B is a top view of an illustrative semiconductor structure that can be used to form a FinFET device, consistent with various illustrative embodiments.

FIG. 1B shows top view "T-view" of structure 100 with cross-sectional views: G-view, F-view, and R-view. As shown, a cross-sectional plane for the R-view lies in the center of fin recess region 134. Various other R-view planes may be used that may not pass through the center of fin recess region 134. Such R-view planes will be described later in the context of related figures.

FIG. 1A and FIG. 1B show various layers that may be presented within structure 100. When structure 100 is used for forming semiconductor devices such as FinFETs, other layers may be deposited such as spacer dielectric layers, interlayer dielectric layers, self-aligned contact layers and/or contact electrodes. Various such layers, not shown in FIG. 1A and FIG. 1B will be discussed in the context of the following figures.

Referring now to the figures, wherein like components are labeled with like numerals, exemplary fabrication steps of forming a semiconductor structure 100 in accordance with various embodiments are shown and will now be described in greater detail below. It should be noted that some of the figures depict various cross-sectional views of structure 100, with figures appropriately labeled to indicate a cross-sectional view. Furthermore, it should be noted that while this description may refer to some components of the structure 100 in the singular tense, more than one component may be depicted throughout the figures. However, it is noted that specific elements may be denoted by a numeral and a subscript (e.g., 100A, etc.). When those elements are referred to generically, merely the numeral is used (e.g., 100, etc.).

Figure 2A:
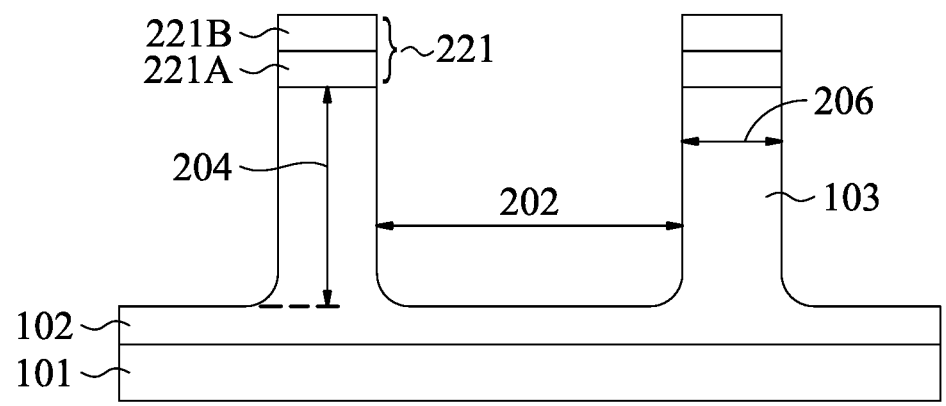
FIGS. 2A-19 are perspective views and cross-sectional views of intermediate structures during steps of forming a semiconductor structure, consistent with various illustrative embodiments.

FIG. 2A illustrates a substrate 102 and fins 103 formed over substrate 102. FIG. 2A also illustrates a step of formation of fins. This step may be one of the steps of a process of fabricating semiconductor structure 100. Substrate 102 may be a semiconductor substrate, such as a bulk semiconductor, a semiconductor-on-insulator (SOI) substrate, or the like, that may be doped (e.g., with a p-type or an n-type dopant) or undoped. Substrate 102 may be a wafer, such as a silicon wafer. Generally, the SOI substrate comprises a layer of a semiconductor material formed on an insulator layer. The insulator layer may be, for example, a buried oxide (BOX) layer 101 that may be formed from silicon oxide, or the like. The insulator layer is provided on a substrate, typically a silicon or glass substrate. Other substrates, such as multi-layered substrates may also be used. In some embodiments, the semiconductor material of the substrate 102 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP or combinations thereof.

Figure 2B:
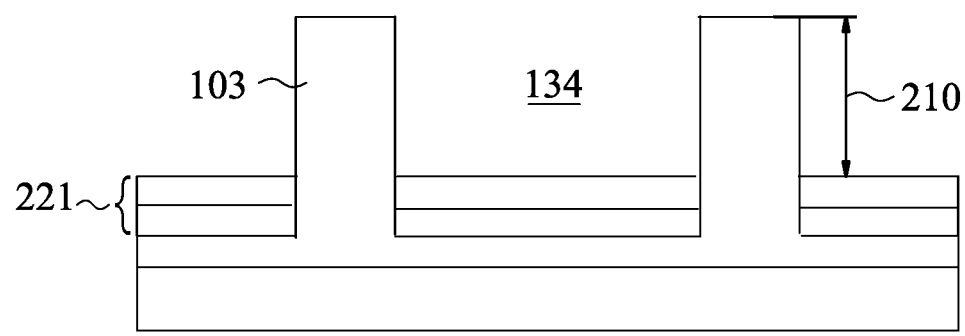

FIG. 2A shows the G-view of part of the structure 100 that includes substrate 102 and fins 103. Fins 103 may have height 204, width 206 and spacing between the fins, referred to as fin pitch, 202. For advanced FinFET devices, height 204, width 206 and fin pitch 202 may be measured in nanometers. In an example embodiment, height 204 may range from 10-200 nm, width 206 may range from 1-50 nm, and fin pitch 202 may range from 10-100 nm. FIG. 2B shows an example embodiment with isolation region 104 deposited between the fins. The isolation region 104 may be formed of a dielectric insulating material. For example, isolation region 104 FIG. 2B shows the height 210 of fins 103 when measured from the top surface of isolation region 104. The part of fins 103 extruding past isolation region is the part of the device that may be controlled by the gate structure 108, as shown, for example, in FIG. 1A.

Fins 103 shown in FIGS. 2A and 2B may be formed through the use of self-aligned double patterning, and subsequent etching, to form fin recess regions between the fins. Illustrative fin recess region 134 are shown in FIGS. 1B and 2B. Fin recess regions 134 may be formed using any suitable etch process, such as a reactive ion etch (RIE), neutral beam etch (NBE), the like, or a combination thereof. The etch may be anisotropic. FIG. 2A shows an illustrative embodiment, of a structure obtained by etching substrate 102. Prior to etching substrate 102, a mask 221 that may include several layers (e.g., layers 221A and 221B) may be formed over the substrate 102, as shown in FIG. 2A. Layer 221A of mask 221 may be a photoresist patterned by an acceptable photolithography process or the like.

Additionally, or alternatively, fins 103 may be formed by epitaxial growth. FIG. 2B shows an illustrative embodiment, of a structure obtained using the epitaxial growth. First, a mask 221 may be deposited over substrate 102 and patterned using, for example, self-aligned double patterning, resulting in a set of openings in the mask. Fins 103 may then be epitaxially grown within the set of openings. For example, fins 103 may be formed by epitaxially growing using metal-organic chemical vapor deposition (MOCVD), molecular beam epitaxy (MBE), liquid phase epitaxy (LPE), vapor phase epitaxy (VPE), selective epitaxial growth (SEG), the like, or a combination thereof.

In various embodiments, after formation of fins 103, mask 221 may be removed. If mask 221 is a photoresist, mask 221 may be removed by an appropriate ashing process, such as using an oxygen plasma. In other embodiments, mask 221 may be removed using an etch, and the like.

In some embodiments, the fins may include a bottom and a top portion. The bottom portion may be etched as described above, and the top portion of fins 103 may be epitaxially grown. In some embodiments, a material of the top portion of fins 103 may be different from a material of the bottom portion of fins 103. In some embodiments, the bottom portion of fins 103 may be formed from the material of substrate 102, such as silicon, and the top portion of fins 103 may be formed from a III-V compound semiconductor. Such materials may include, but are not limited to, InAs, AlAs, GaAs, GaAsP, InP, GaInP (In %=1-90%), AlInP (In %=1-90%), GaN, InGaAs (In %=1-90%), InAlAs (In %=1-90%), InGaAlAs (In %=1-90%), GaSb, AlSb, AlP, GaP, and the like. In other embodiments, the top portion of fins 103 may include other materials, such as silicon, silicon carbide, germanium, a II-VI compound semiconductor, or the like.

Prior to formation of fins 103 (either by etching or by epitaxial growth), a planarization process, such as chemical mechanical polish (CMP) may be used for substrate 102 to polish the top surface of substrate 102.

Figure 2C:
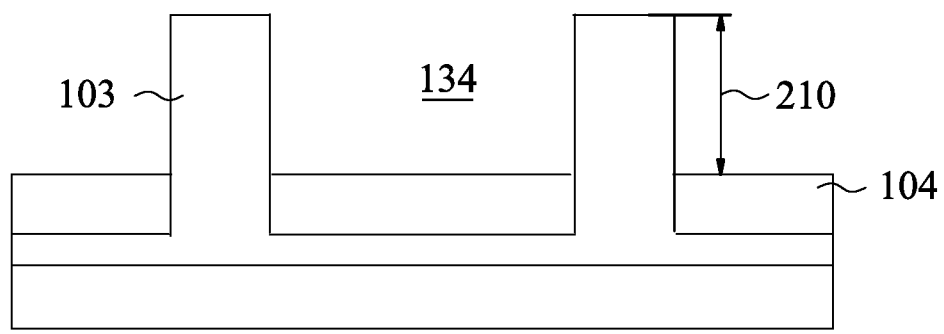

Following a step of forming fins 103 either by etching fin recess region 134 (or forming recess region 134 by epitaxially growing fins), as shown respectively in FIGS. 2A and 2B, the insulation material for isolation region 104 may be deposited in fin recess region 134, as shown in FIG. 2C. Insulation material for isolation region 104 may be an oxide, such as silicon oxide, a nitride, or the like, or a combination thereof, and may be deposited by a high-density plasma chemical vapor deposition (HDP-CVD), a flowable CVD (FCVD) (e.g., a CVD-based material deposition in a remote plasma system and post curing to convert to another material, such as an oxide), the like, or a combination thereof. Other insulation materials formed by any suitable process may be used. An anneal process may be performed once the insulation material is formed. In various embodiments, isolation region 104 may include two or more sublayers formed from different insulation materials. For example, the first sublayer may be an oxide layer followed by a nitride layer. An illustrative embodiment of such sublayers is shown in FIG. 3B by layers 310A and 310B.

Figure 3A:
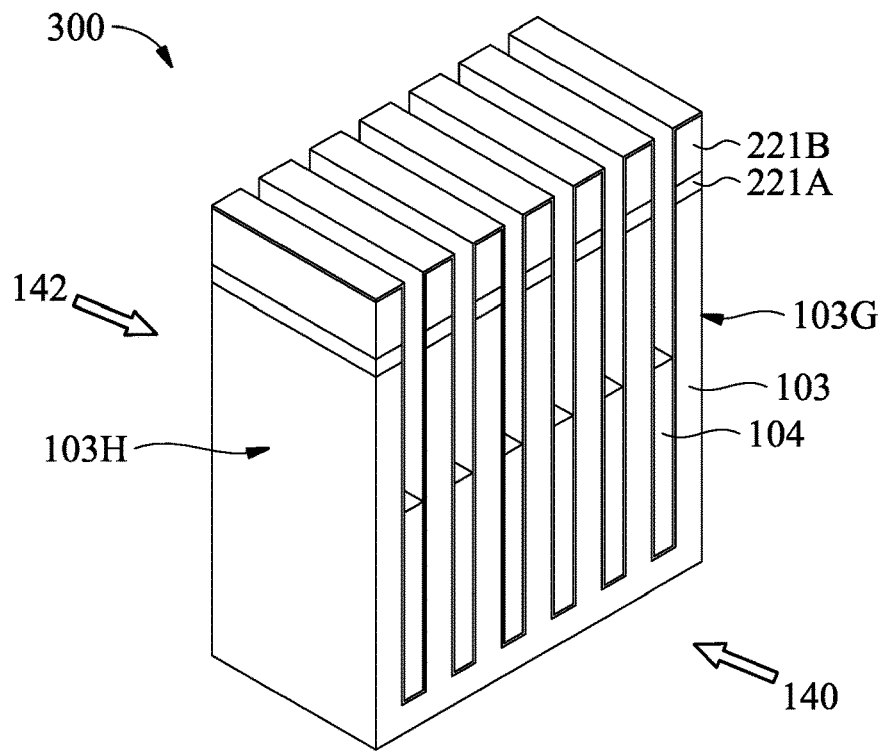
Figure 3B:
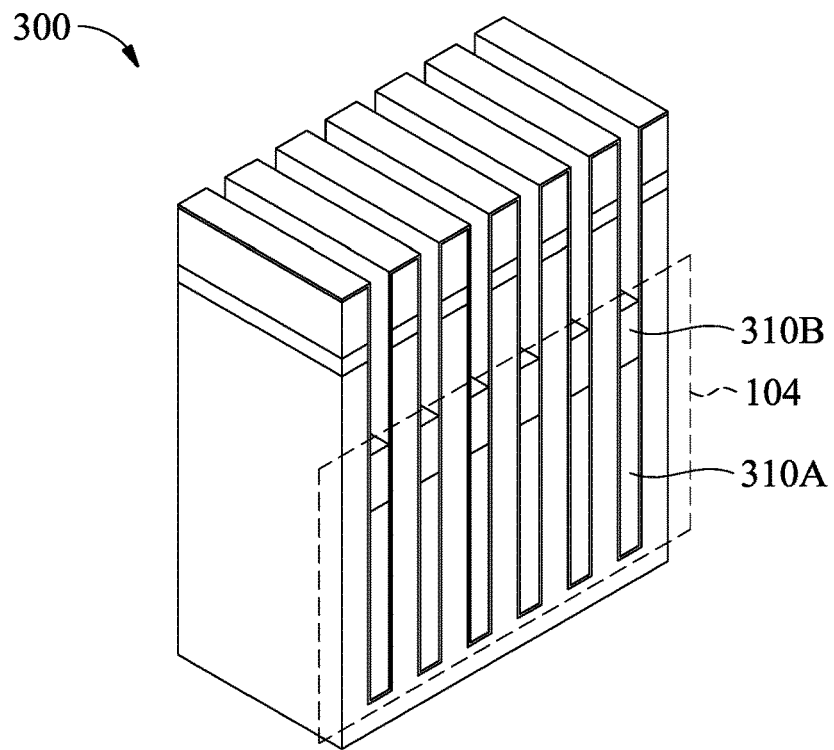

FIG. 3A shows a perspective view of an exemplary structure 300 including fins 103, isolation regions 104, and mask layers 221A and 221B. In some cases, fins 103H and 103G at the borders of structure 300 may be formed but not used for fabrication of the FinFET device. FIG. 3B shows an illustrative embodiment of structure 300, where isolation region 104 may include a first and a second insulating sublayer 310A and 310B. In various embodiments, more than two insulating sublayers may be used. In an illustrative embodiment, insulating layer 310A may be formed from silicon oxide, and insulating layer 310B may be formed from silicon nitride. In various embodiments, various insulating materials may be used. In some embodiments, insulating layer 310B may be an etch stop layer.

Figure 4A:
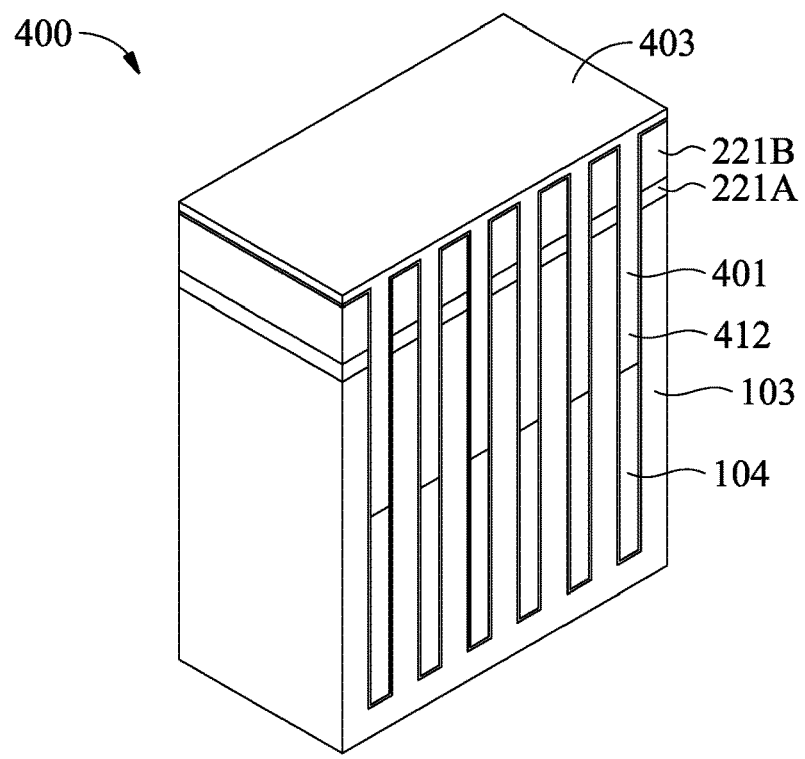

Following a step of depositing insulation material for isolation region 104 in fin recess region 134 as shown in FIGS. 2B through 3B, a filled region 401 may be formed by depositing a filler material in fin recess region 134 resulting in a filled structure 400 as illustrated in FIG. 4A. In an example embodiment, structure 400 may include filled region 401 containing a filler material 412, layers 221A, and 221B, isolation region 104 and fins 103. Alternatively, layers 221A and 221B may be removed prior to depositing the filler material 412. The filler material may be SiGe and may be formed by an epitaxial growth using CVD, low pressure chemical vapor deposition (LPCVD), ultra-high vacuum chemical vapor deposition (UHVCVD), molecular beam epitaxy (MBE) and/or the like. Epitaxial growth of SiGe may result in filled structure 400 containing no vacancies or/and cracks. Other materials with high etch selectivity relative to the material forming fins 103 and substrate 102 may be used. In an example embodiment, etch selectivity of the filler material relative to the material forming fins 103 may be higher than seven. In some embodiments, the filler material may comprise silicon oxide or silicon nitride. An anneal process may be performed once filled region 401 is formed. FIG. 4A shows a top surface 403 of filled semiconductor structure 400 that may be fabricated using a planarization process, such as CMP to remove any excess of filler material.

Epitaxial growth of filler material 412 may include the formation of filler material with a target morphology. The term "morphology" refers to the material structure (i.e., the presence of dislocations, point defects, impurities, cracks, shape, and size of nanostructures, material compositional variation and similar metrics). In an example embodiment, filler material 412 may contain regions that may have different morphology. For example, a filler material may contain a first region adjacent (or proximate) to fins' surfaces that may have the first morphology, while the second region remote from fins' surfaces may have the second morphology. For example, the first region is formed to contain low dislocation density and/or low point defect density, while the second region may be formed to contain higher dislocation density and/or higher point defect density. In some embodiments, the first or the second region may experience tensile or compressive stresses due to the presence of the second or the first region, respectively. The stresses and dislocations presented in the regions may affect the etch rate of these regions. In various embodiments, the deposition of filler material 412 may be selected for high etch selectivity relative to the material forming fins 103. In some embodiments, the filler material may be etched at a high etch rate when comparing to an etch rate of the material forming fins 103. In some embodiment, during the epitaxial growth of filled region 401 formed of SiGe, a composition of germanium may be varied. In some embodiments, the molar fraction of germanium may be higher adjacent, or in proximity to fins' surfaces, and in some embodiments, the molar fraction of germanium may be higher in regions remote from fins' surfaces. Described examples of variations of the composition of germanium embodiments are only illustrative, and various other variations within filled region 401 can be used. For example, in some embodiments, variations in the composition of filled region 401 may be correlated in morphological changes through filled region 401.

Morphological properties of filled region 401 may be controlled by parameters of the epitaxial growth of material forming filled region 401. For example, during the epitaxial growth, the changes in temperature, pressure, and concentration of precursors may be used to control the morphological properties of filled region 401.

Figure 4B:
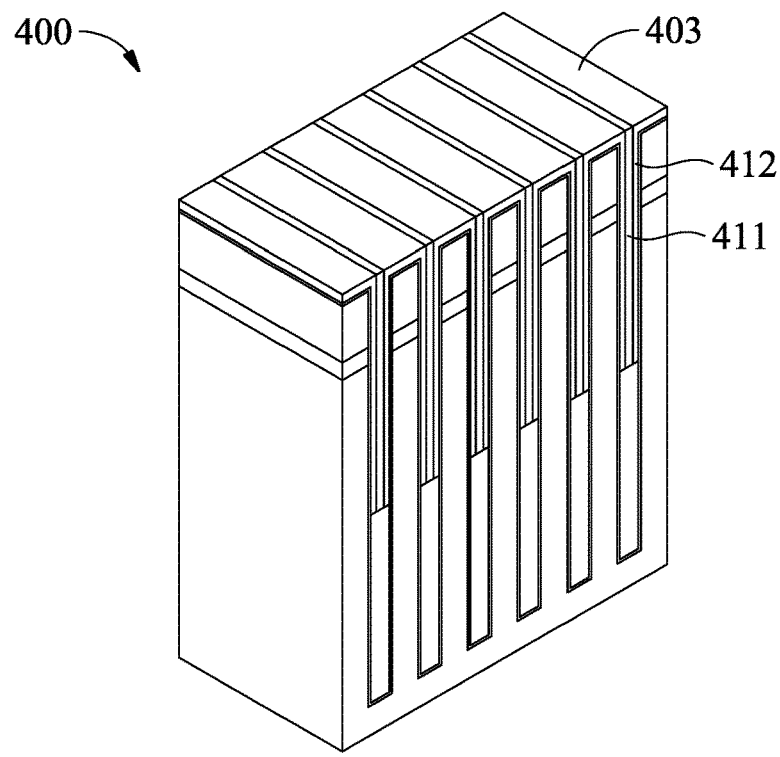

FIG. 4B shows an illustrative embodiment of a structure 400 with filled region 401 using more than one filler material (e.g., filler material 412 and 411). For example, filler material 412 may include SiGe and may be deposited using epitaxial growth. In some embodiments, layers comprising material 412 may be 1-100 nm thick. The filler material 411 may include an insulating material such as silicon oxide, silicon nitride, and/or the like, or a combination thereof. The insulating material may be deposited using CVD, Atomic Layer Deposition (ALD) and/or the like. In some embodiments, the filler material 411 may form an insulating layer located within fin recess region 134 as shown in FIG. 4B. In some embodiments, the insulating layer may be 1-100 nm thick. In some embodiments, the thickness of the layer formed by material 412 may be limited by allowed stresses presented in this layer. For example, SiGe formed on surfaces of fins may exhibit compressive stresses due to lattice mismatch with the material forming fins 103.

Similar to the process of forming filled region 401 formed from a single filling material, an anneal process may be performed for filled region 401, which may be formed from more than one filler material. Further in FIG. 4B a planarization process, such as CMP, may remove any excess of filler material 412 and 411 resulting in a top surface 403 of a filled semiconductor structure 400. While only two filler materials 412 and 411 are depicted in FIG. 4B, more than two materials may be present. For example, several insulating materials may be used to form an insulating layer 411. In an illustrative embodiment, insulating layer 411 may include sublayers of insulating material. In an example embodiment, sublayers may be formed from the insulating material with an etch rate similar to the etch rate of material 412.

Figure 5A:
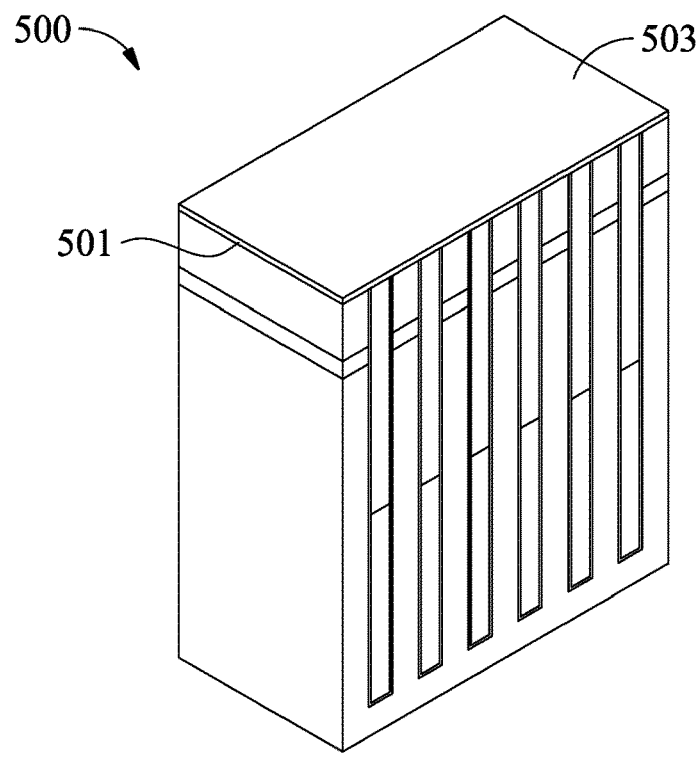
Figure 5B:
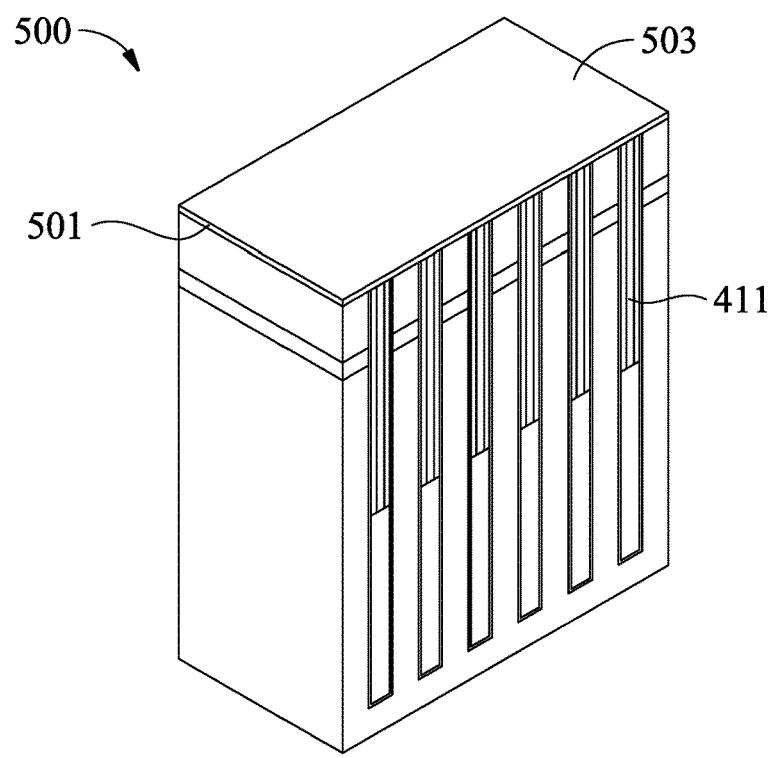

Following a step of forming filled region 401, an insulating layer 501 may be formed by depositing insulating material over surface 403 as illustrated in FIG. 5A and FIG. 5B. FIGS. 5A and 5B show an illustrative embodiment of semiconductor structure 500 including insulating layer 501 formed over top surface 403 of filled semiconductor structure 400. FIG. 5A, shows semiconductor structure 500 related to semiconductor structure 400, as shown in FIG. 4A, and FIG. 5B shows semiconductor structure 500 related to structure 400 as shown in FIG. 4B. Structure 500 may have a top surface 503 according to illustrative embodiments shown in FIGS. 5A and 5B. Insulating layer 501 may, in some embodiments, serve as an etch stop layer and/or may provide other functions. Insulating layer 501 may include an insulating material such as SiN, $SiO_2$, $HFO_2$, ZnO, ZrN, and/or the like. Layer 501 may be formed using low-pressure chemical vapor deposition (LPCVD), CVD, Atomic Layer Deposition (ALD), Plasma Enhanced Chemical Vapor Deposition PECVD, or other known formation techniques. The thickness of insulating layer 501 may range from 1 nm to 100 nm.

Figure 6A:
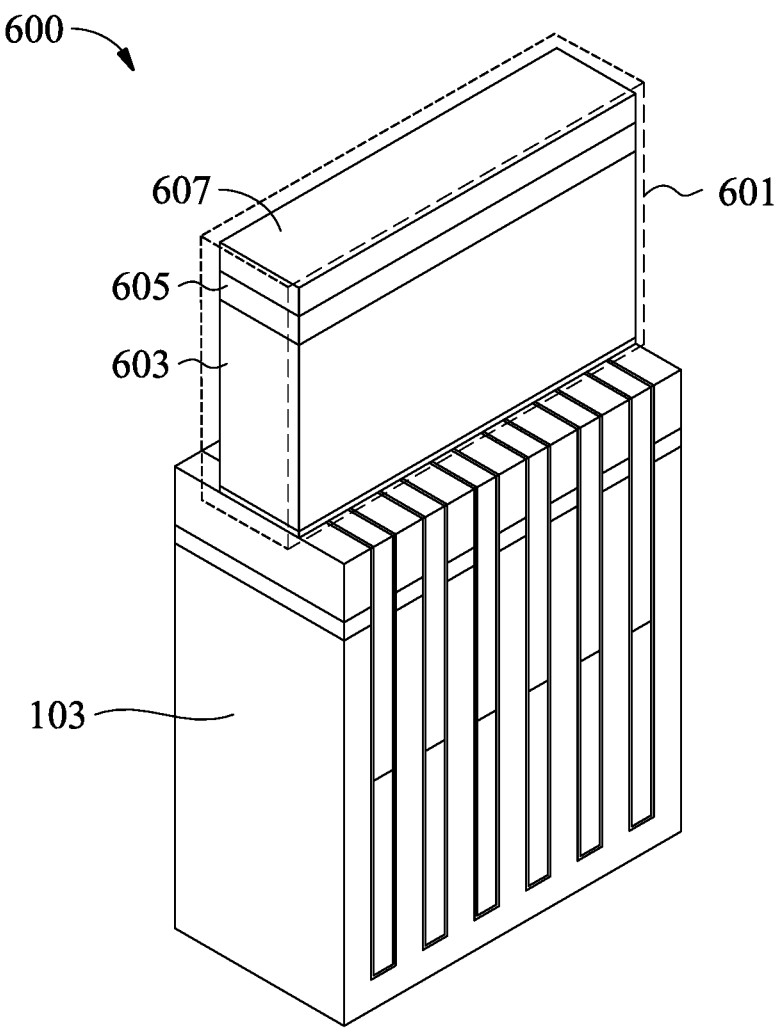

Following a step of forming insulating layer 501, a top layer 601 may be formed by depositing top layer 601 over a portion of surface 503, followed by etching portions of insulating layer 501, resulting in structure 600 illustrated in FIG. 6A. In an example embodiment, layer 501 may be an etch stop layer for preventing etching of the underlying layers. Top layer 601 may include sublayers 603, 605 and 607. Top layer 601 may cover a portion of top surface 503 of structure 500 and can be fabricated via deposition of sublayers 603, 605 and 607 over top surface 503 and masking a portion of sublayers 603, 605 and 607, following by an etching step of unmasked sublayers. The etching step may include dry or wet etching. For example, a dry etching process may use chlorine-containing gases, fluorine-containing gases, other etching gases, or a combination thereof. The wet etching solutions may include $NH_4OH$, HF (hydrofluoric acid) or diluted HF, deionized water, TMAH (tetramethylammonium hydroxide), other suitable wet etching solutions, or combinations thereof. In some embodiments, several etching steps may be performed. For example, in a first step a buffered oxide etching (BOE) may be performed, to remove sublayers 605 and 607, followed by dry etching using a chlorine-based plasma to remove sublayer 603. The examples of possible etch steps are only illustrative, and other etch steps may be used.

In an alternative embodiment, a masking layer may be deposited over top surface 503, following a step of photolithography, resulting in the formation of an opening for deposition of top layer 601. In an illustrative embodiment, the top layer may be deposited in the formed opening in the masking layer. In an illustrative embodiment, the masking layer may be removed exposing insulating layer 501. Exposed insulating layer 501 may be etched following the step of removing the masking layer.

Various materials may be used to form sublayer 607, 605 and 603 according to various illustrative embodiments. For example, sublayer 607 may be an oxide layer such as silicon oxide, sublayer 605 may be a layer of insulating material such as silicon nitride, and sublayer 603 may be polycrystalline silicon. Described materials are only illustrative, and various other materials may be used.

Figure 6B:
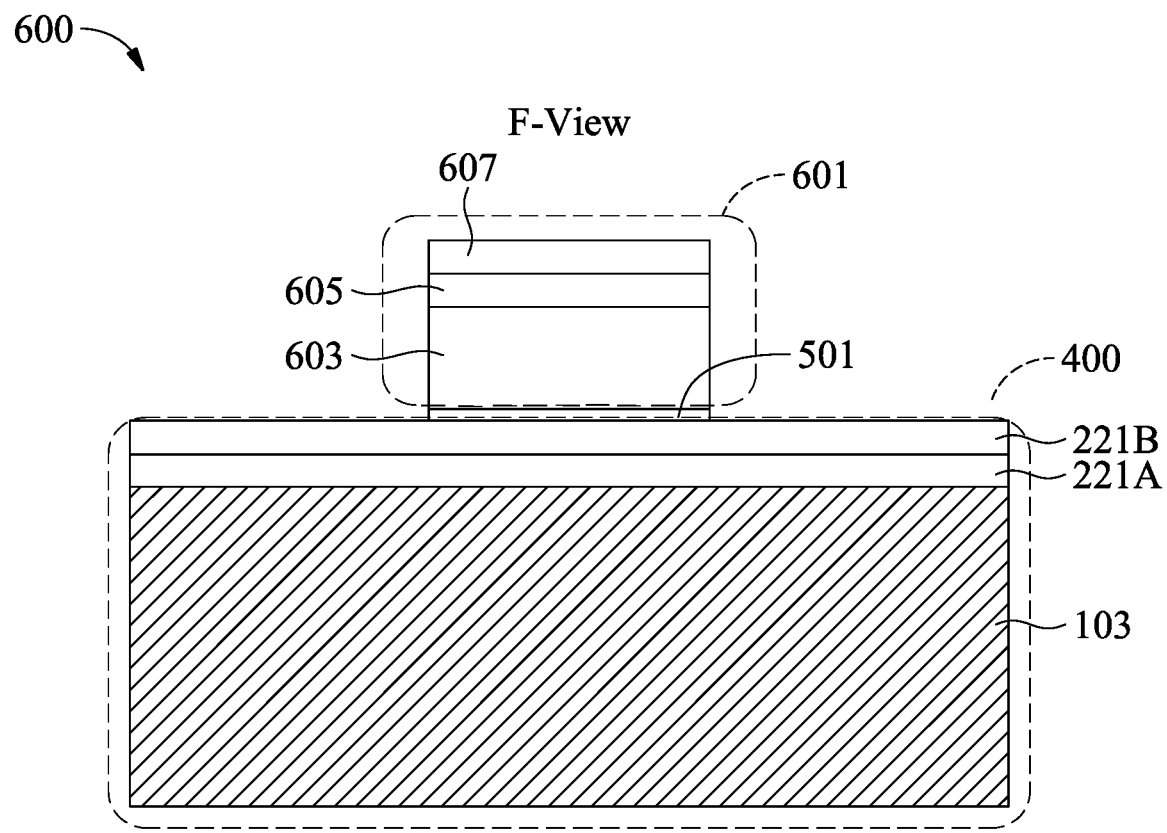

FIG. 6B shows an illustrative cross-sectional F-View of structure 600. Structure 600 contains fin 103, layers 221B and 221A as described above, insulating layer 501, and top layer 601 having sublayers 603, 605 and 607. Top layer 601 may be used as a mask layer to cover a first portion of the filled semiconductor structure 400. Filled semiconductor structure 400 may be etched in regions not covered by top layer 601. Structure 400 may be etched using any suitable etch process, such as a reactive ion etch (RIE), neutral beam etch (NBE), the like, or a combination thereof. In some embodiments, wet etching may be used and may include tetramethylammonium hydroxide (TMAH), ammonium hydroxide ($NH_4OH$), or any other wet etchant capable of etching structure 400. The etch may be anisotropic and etch the only portion of structure 400 that is not covered by top layer 601.

Figure 7A:
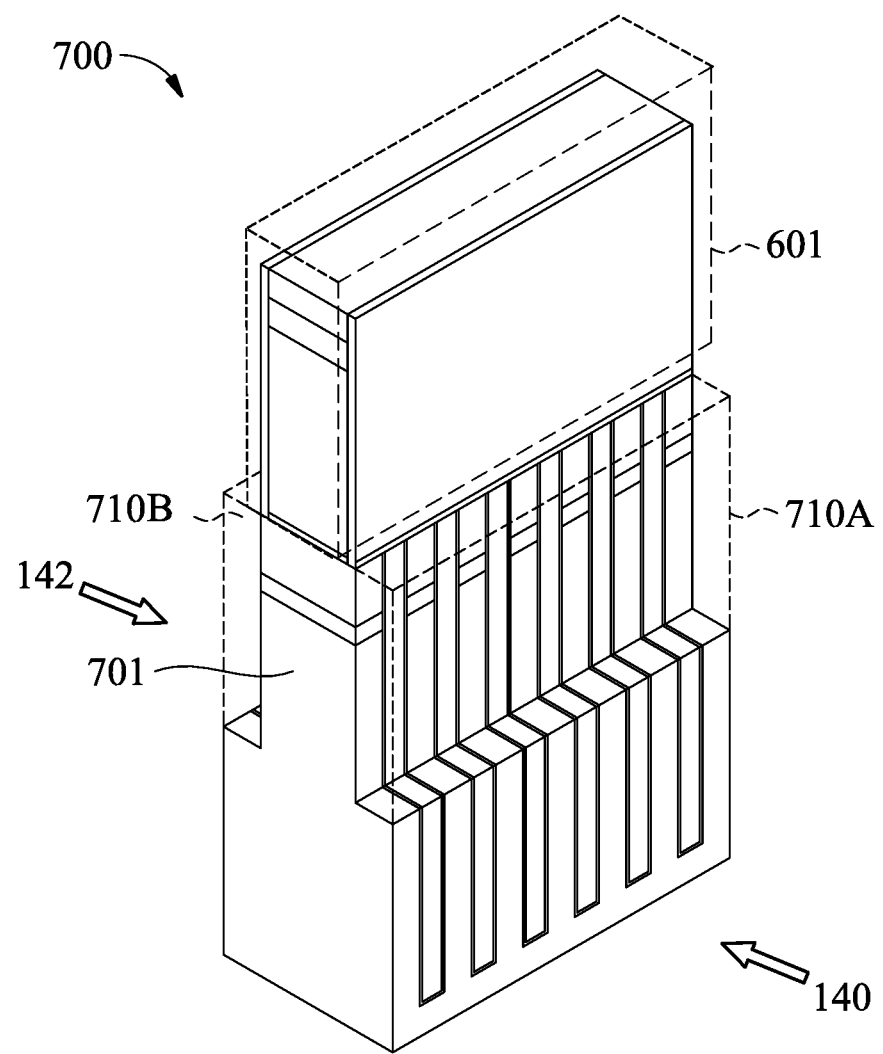
Figure 7B:
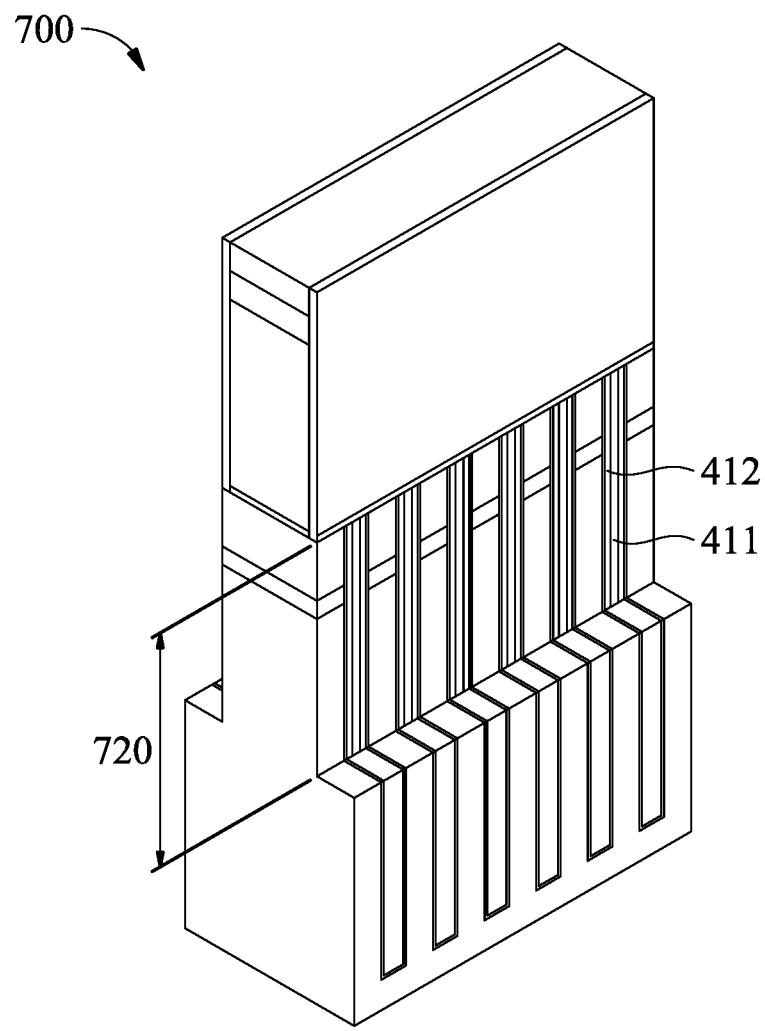

Following a step of forming a top layer 601, source/drain recess regions 710 may be formed by etching a portion of structure 400 (structure 400 is shown in FIGS. 4A and 4B) that is not covered by top layer 601, resulting in a stepped semiconductor structure 700, as illustrated in FIG. 7A. For clarity of description, the first portion of the semiconductor structure may be covered by top layer 601, and a second portion of semiconductor structure may be etched resulting in source/drain recess regions 710A and 710B as shown in FIG. 7A. FIG. 7B shows another illustrative embodiment, where filler materials 411 and 412 are used between the fins. In an illustrative embodiment, depending on filler material 411 and 412, structure 700, shown in FIG. 7B may include recess regions 710A, and 710B that may be formed by etching structure 400, as shown, for example, in FIG. 4A, according to various known techniques. For example, recess regions 710A and 710B may be first etched using dry etching, and then etched using wet etching.

Figure 7C:
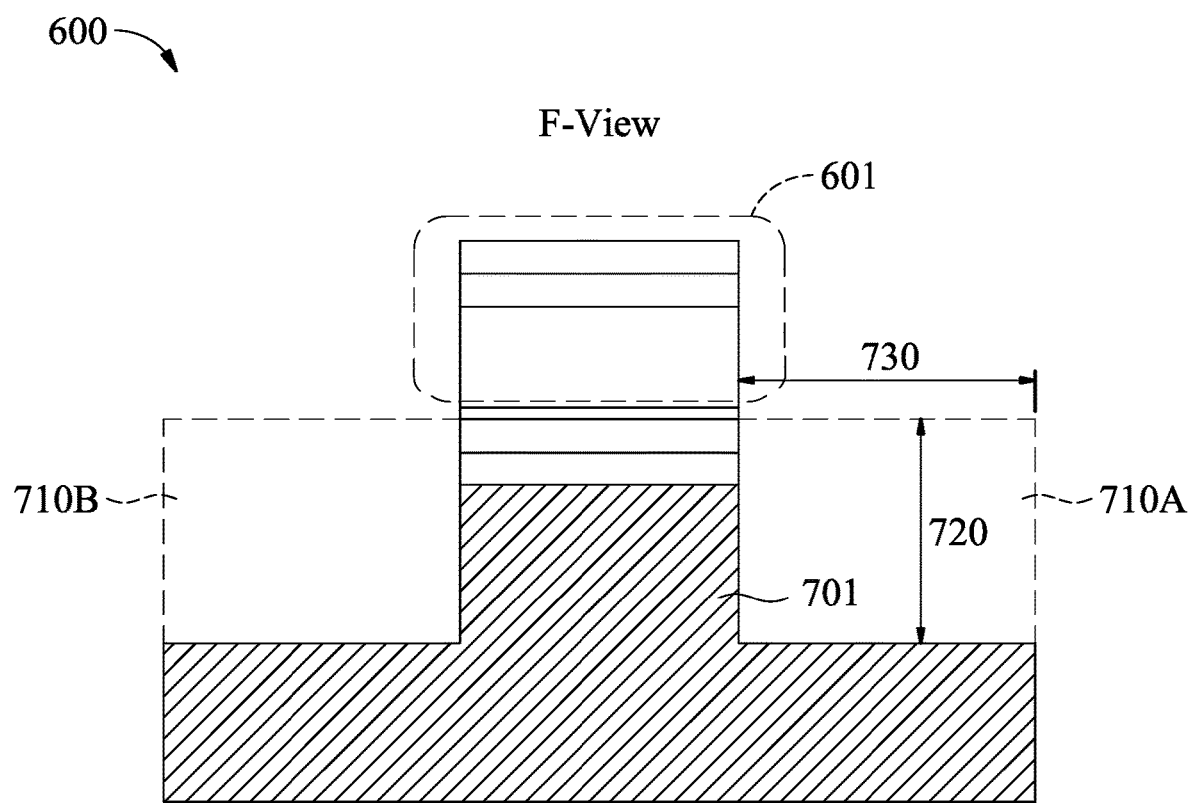

FIG. 7C shows an F-View of structure 700 including fin region 701, front and back source/drain recess regions 710A and 710B (also referred herein collectively as regions 710) respectively, and top layer 601. Fin region 701 is formed after etching source/drain recess regions 710A and 710B as described above. In some embodiments, region 710A is a source recess region, and region 710B is a drain recess region. In other embodiments, region 710A is a drain recess region, and region 710B is a source recess region.

FIG. 7C shows that in various embodiments, the depth 720 of source/drain recess regions 710 may be selected for optimal performance of the semiconductor device formed from structure 700. In an example embodiment, depth 720 may be at least as large or larger than height 210 of fins 103 when measured from the top surface of isolation region 104, as shown in FIG. 2B. In some embodiments, the process of etching structure 700 may stop when a top surface of isolation region 104 is reached resulting in depth 720 being the same as fin height 210, as shown in FIG. 2B. In various embodiments, the width 730 of source/drain recess regions 710 may be selected to allow the formation of source and drain regions as further described below, as well as the formation of insulating spacer layers separating source/drain region and gate structure as described below.

Figure 8A:
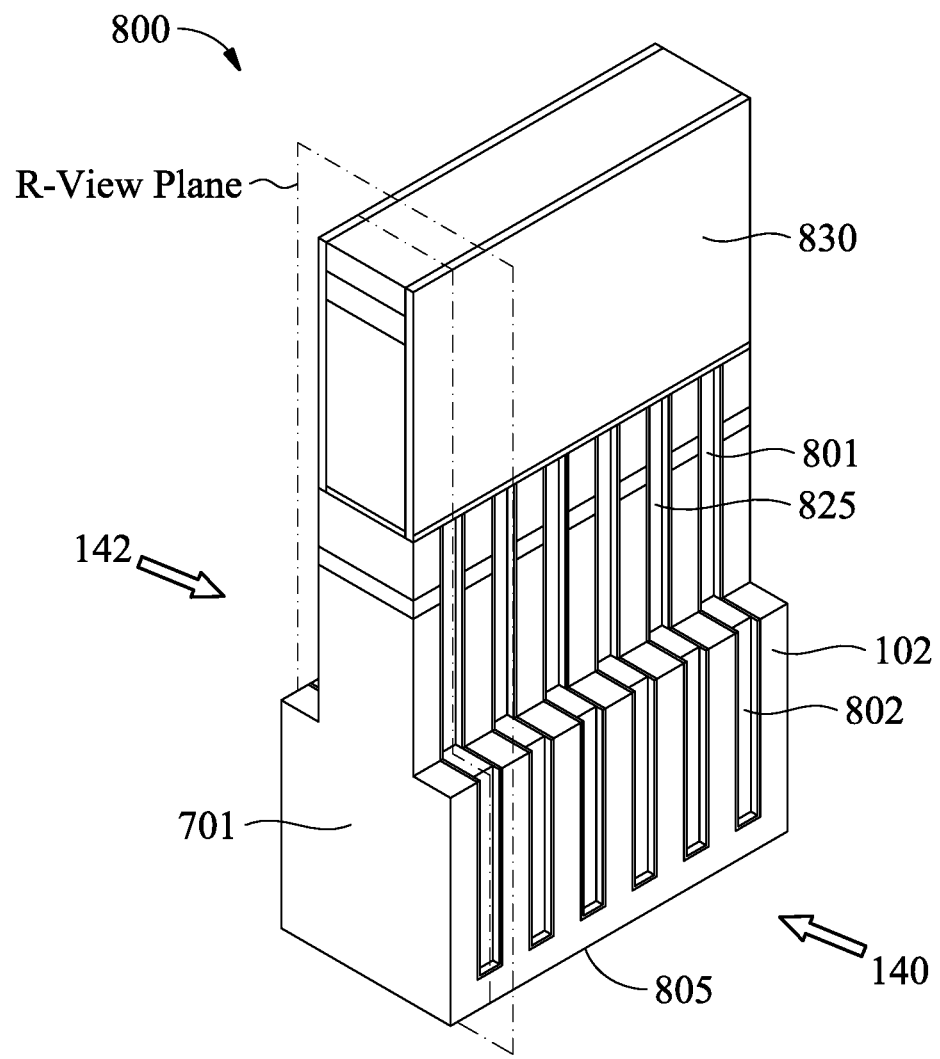
Figure 8B:
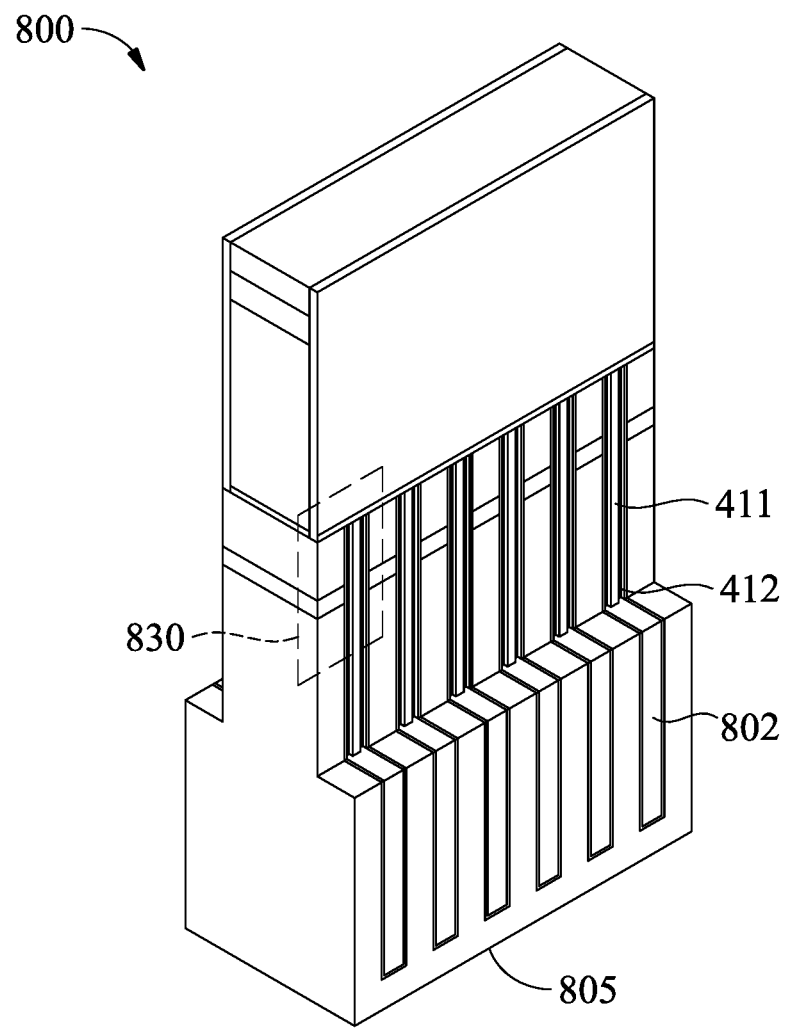
Figure 8C:
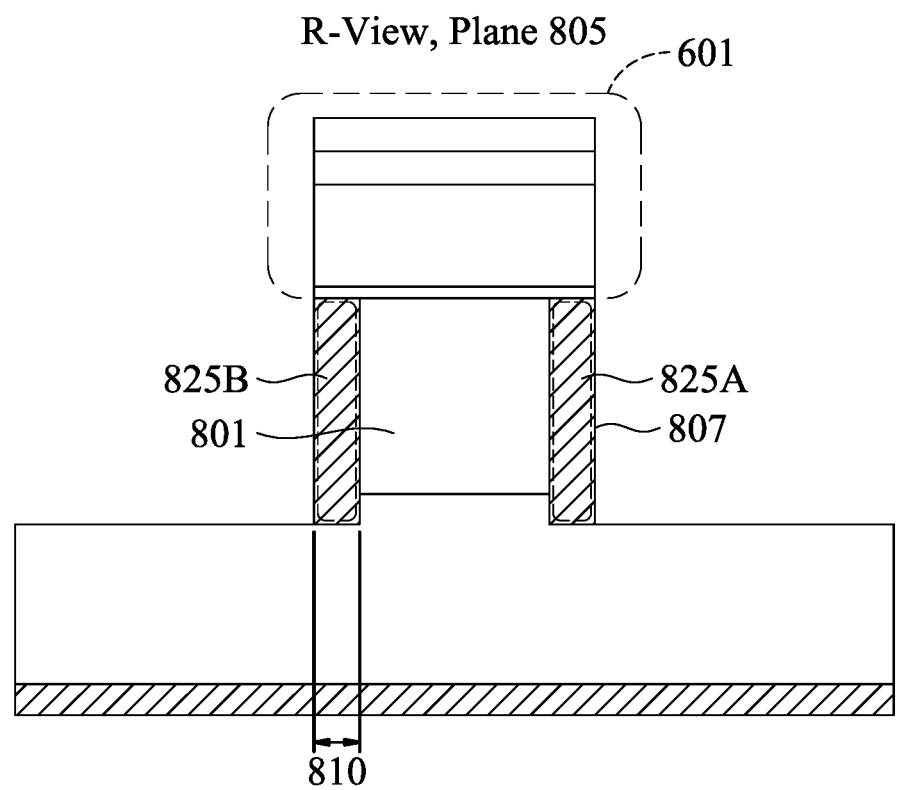
Figure 8D:
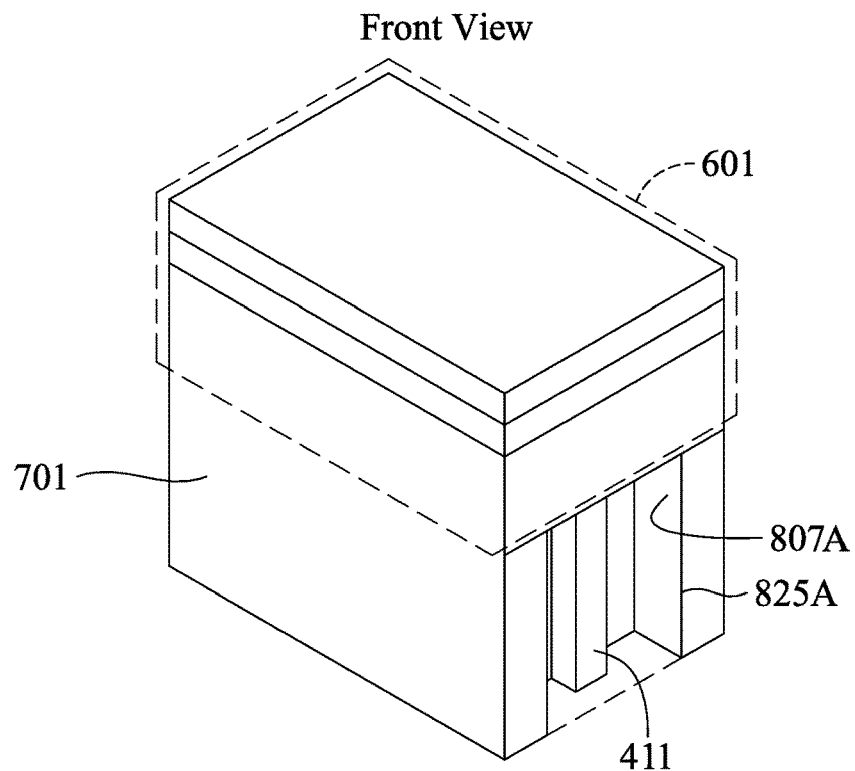
Figure 8E:
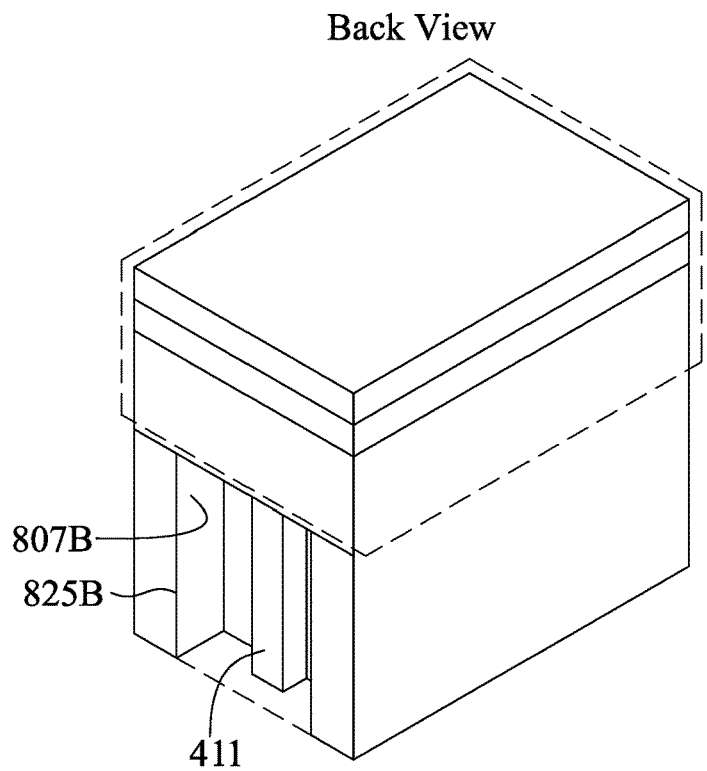

Following a step of etching a portion of structure 400 (structure 400 is shown in FIGS. 4A and 4B), filled region 401, as shown, for example, in FIG. 4A, may be partially etched laterally as illustrated in FIG. 8A. FIGS. 8A-8C show illustrative embodiments of an etched semiconductor structure 800. In an illustrative embodiment shown in FIG. 8A, structure 800 may include substrate 102, fin region 701, and etched filled region 801. In some embodiments, region 802 may not be etched (e.g., as shown in FIG. 8B), and in some embodiments, region 802 may be partially etched (e.g., as shown in FIG. 8A). The etched isolation region 802 may be part of isolation region 104 (region 104 is shown in FIG. 1A) formed after etching source/drain recess regions 710 (e.g., as shown in FIG. 7A) and etched filled region 801 may be part of filled region 401 (e.g., as shown in FIG. 4A) formed after etching source/drain recess regions 710, as well as an additional etch step described herein. The additional etch step of filling region 801 may include etching filled region 801 from front side 140 and back side 142 resulting in front and back sidewall trenches 825 depicted in FIG. 8A. FIG. 8B shows another illustrative embodiment with etched filled region 801 containing etched insulating layer 411. FIG. 8C shows an R-View of structure 800 taken at a cross-sectional plane 805, as depicted in FIG. 8A. In an example embodiment, FIG. 8C shows etched filled region 801 containing front trench 825A and a back trench 825B. In various embodiments, fin region 701 (e.g., shown in FIG. 8A) includes a surface 807 including a side surface of trenches 825 shown in FIG. 8A and in FIG. 8C. The width 810 of surface 807 may correspond to the depth of front and back trenches 825. FIG. 8C shows that top layer 601 extends over the back and front trench. Returning to FIG. 8B, in some embodiments, material 411 may not be etched, while material 412 may be etched. In some embodiments, as shown in FIGS. 8D and 8E, material 411 may be partially etched (e.g., as shown in FIG. 8A). In some embodiments, as shown in FIGS. 8D and 8E insulating layer 411 may protrude into trenches 825, with the amount of protrusion depending on etching method used to form trenches 825.

For clarity, FIGS. 8D and 8E show perspective front and back views respectively of a region 830 schematically indicated in FIG. 8B. FIG. 8D displays parts of region 830 such as top layer 601, etched fin 701, front trench 825A, surface 807A, and insulating layer 411 according to an example embodiment. Similarly, FIG. 8E displays a perspective back view of structure 800 and depicts surface 807B, back sidewall trench 825B and insulating layer 411.

Figure 9A:
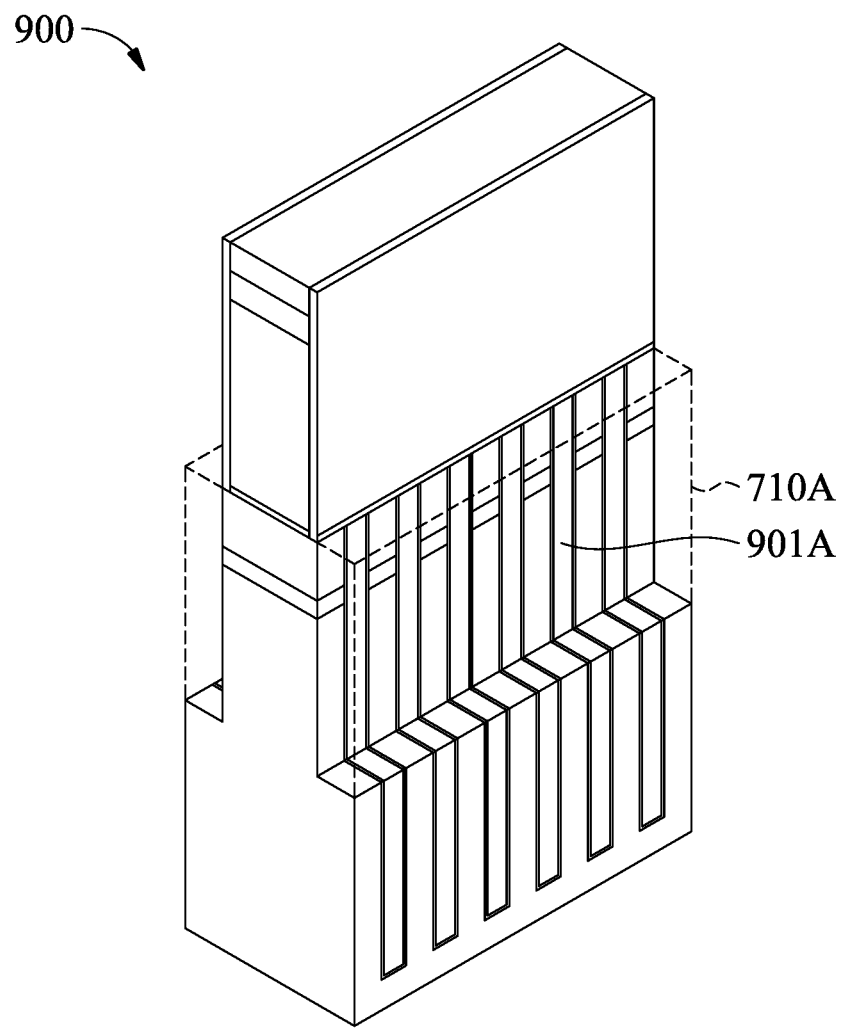
Figure 9B:
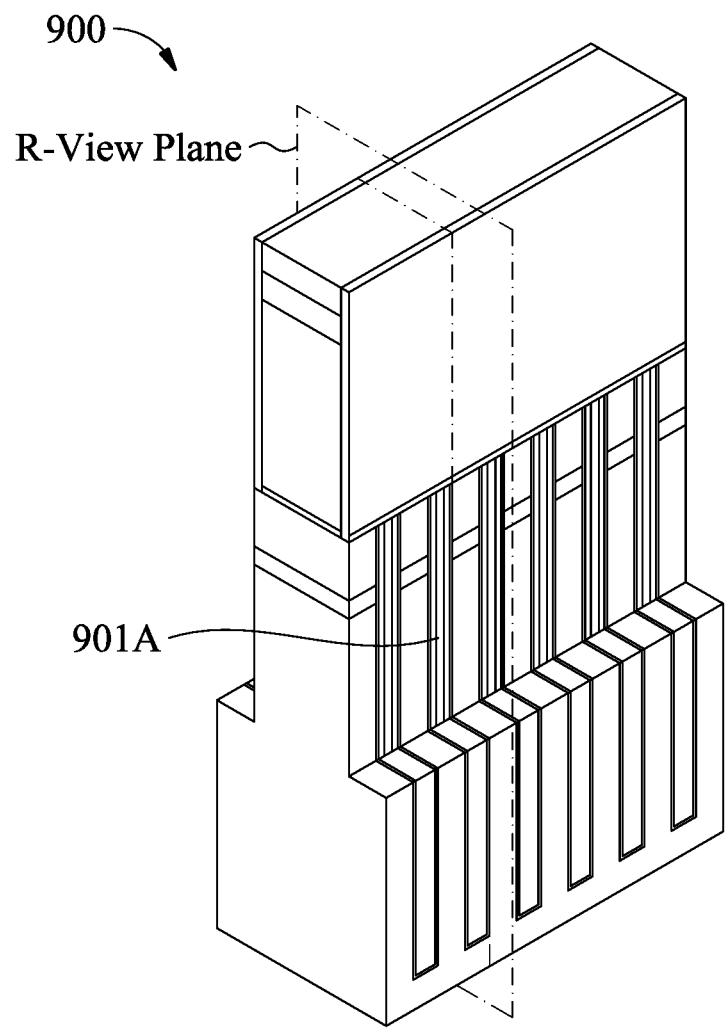
Figure 9C:
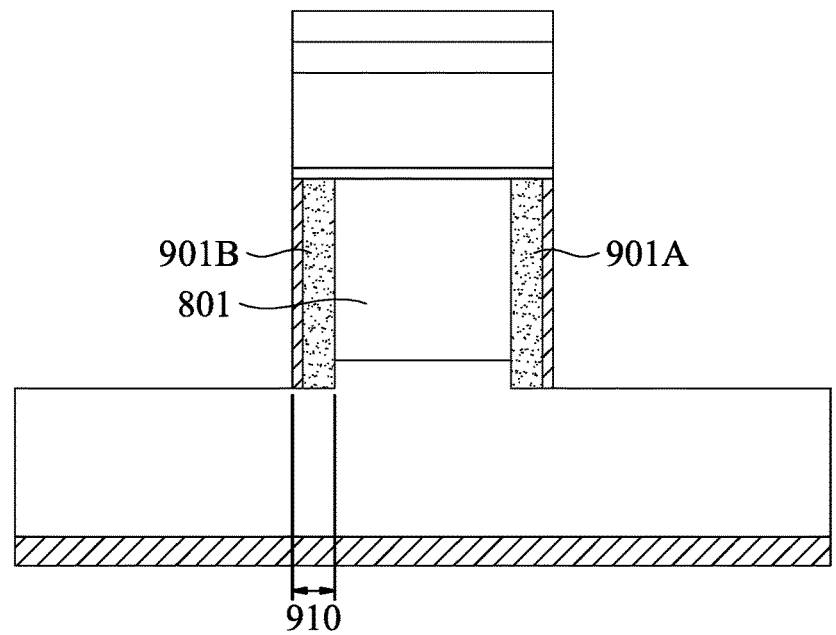
Figure 9D:
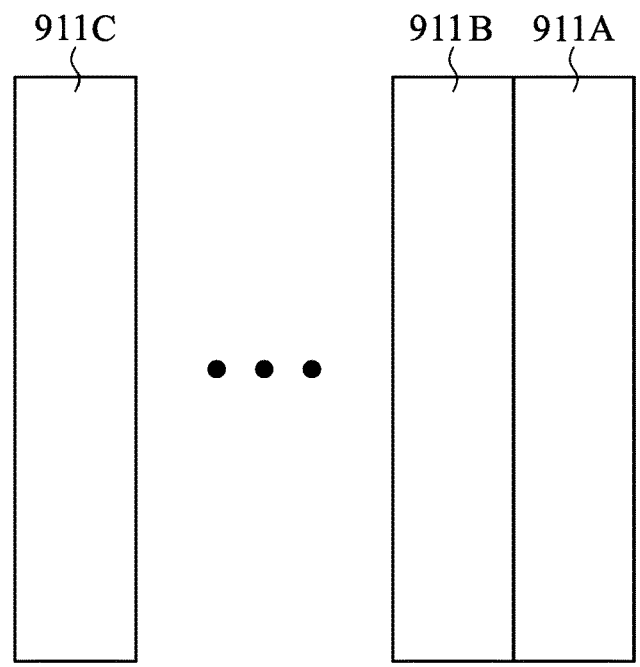

In various embodiments, insulating layers 901 may be deposited in front and back trenches 825 as illustrated in FIG. 9A. FIGS. 9A-9C show an illustrative embodiment of a structure 900 obtained by depositing an insulating layer 901A into front trench 825A, where insulating layer 901A is formed adjacent to region 710A. FIG. 9C shows an illustrative R-View of structure 900 at a cross-sectional plane passing through layer 901A, as shown in FIG. 9B, according to an illustrative embodiment. In an example embodiment, FIG. 9C shows insulating layers 901A and 901B deposited into corresponding front and back trenches 825A and 825B, as shown, for example, in FIGS. 8D and 8E. In various embodiments, width 910 of insulating layer 901 is selected to prevent electrical conductivity through insulating layer 901. FIG. 9D shows an example embodiment of insulating layer 901A or 901B formed from several dielectric sublayers 911A-911C. Some of the illustrative materials for dielectric sublayers may include SiO, LaO, AlO, AlN, AlON, ZrO, HfO, SiN, Si, ZnO, ZrN, TiO, TaO, ZrAlO, YO, TaCN, ZrSi, HfSi, SiOCN, SiOCN, SiOC, and SiCN. The dielectric sublayers may be formed using low-pressure chemical vapor deposition (LPCVD), CVD, ALD, PECVD, or other known formation techniques. In various embodiments, insulating layer 901 may be formed from a material with high etch selectivity relative to filler material of filled region 401. FIG. 9B shows an illustrative embodiment when insulating layer 901 is deposited in trenches 825 (trench 825A as shown, for example, in FIG. 8B) containing insulating layer 411.

Figure 9E:
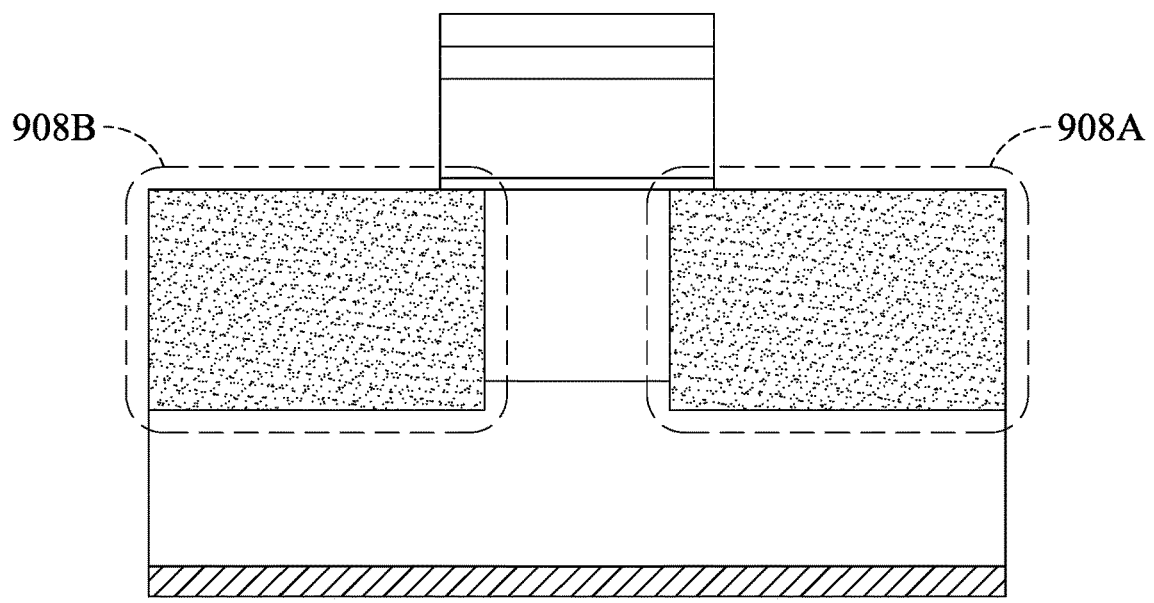
Figure 9F:
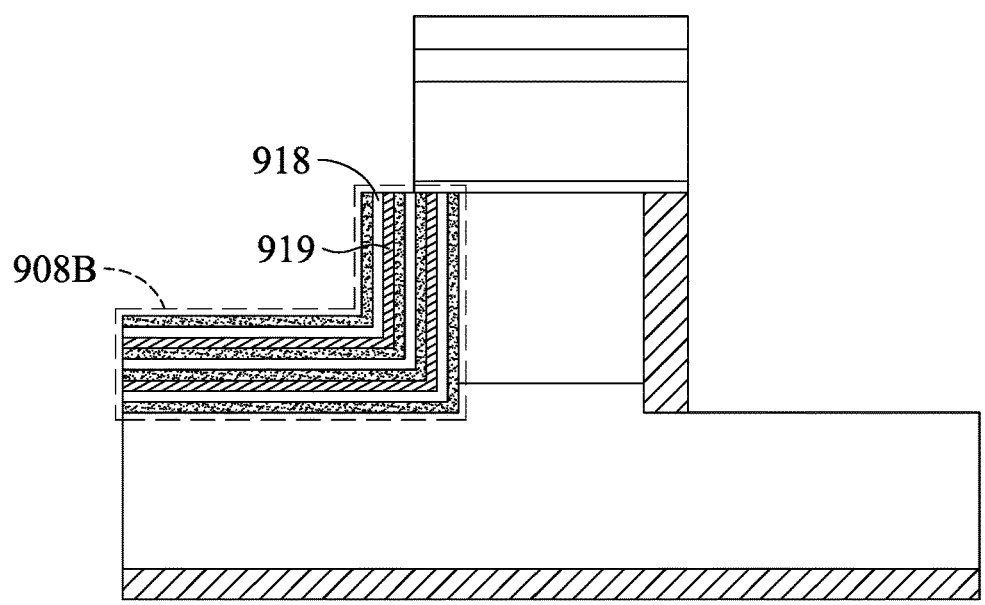

Additionally, or alternatively, an insulating material (e.g., the material forming insulating layer 901) may be deposited not only in trenches 825 but also in parts of source/drain recess regions 710A and 710B. In an illustrative embodiment depicted in FIG. 9E, the insulating material may be deposited into recess regions 710 and may form insulating regions 908. In some embodiments, insulating regions 908 may include multiple dielectric layers (e.g., 918 and 919) deposited one after another as shown in FIG. 9F. In an illustrative embodiment shown in FIG. 10A, a portion of the insulating region may be removed, forming a recess region 1010 and a region 1011. Recess region 1010 may be formed using various known etching techniques for etching insulating materials (e.g., BOE).

Figure 10A:
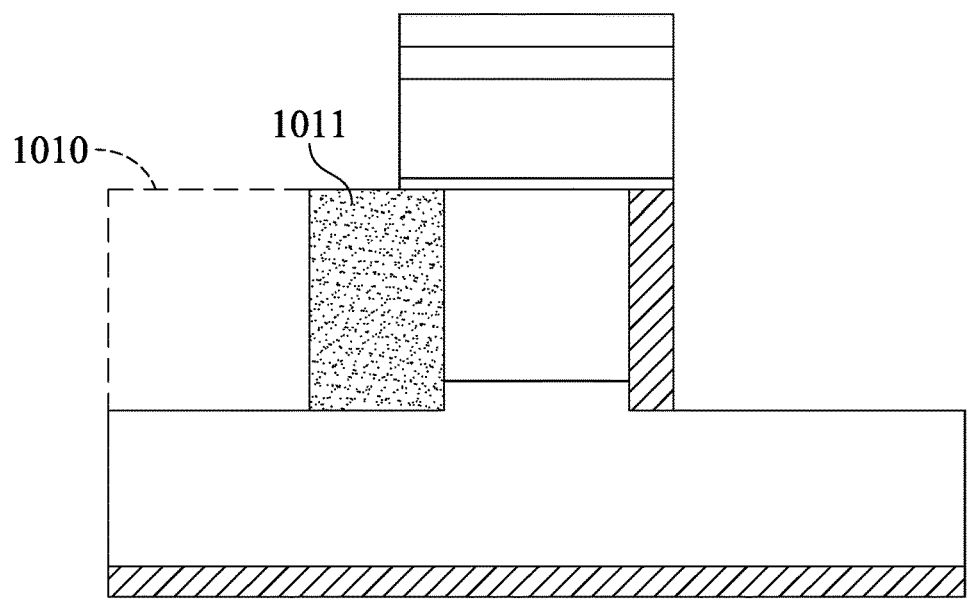
Figure 10B:
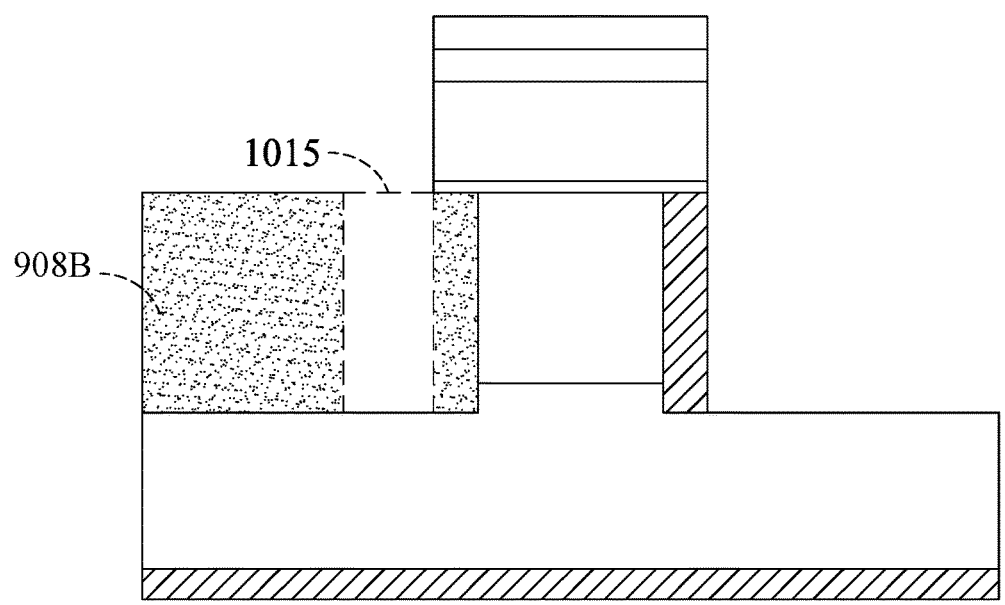
Figure 10C:
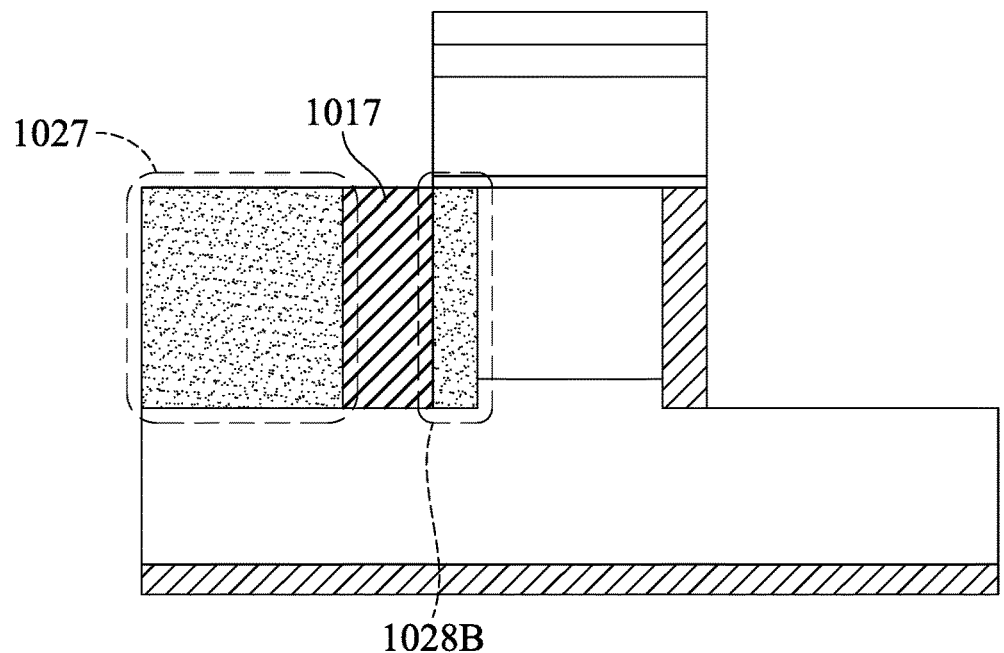
Figure 10D:
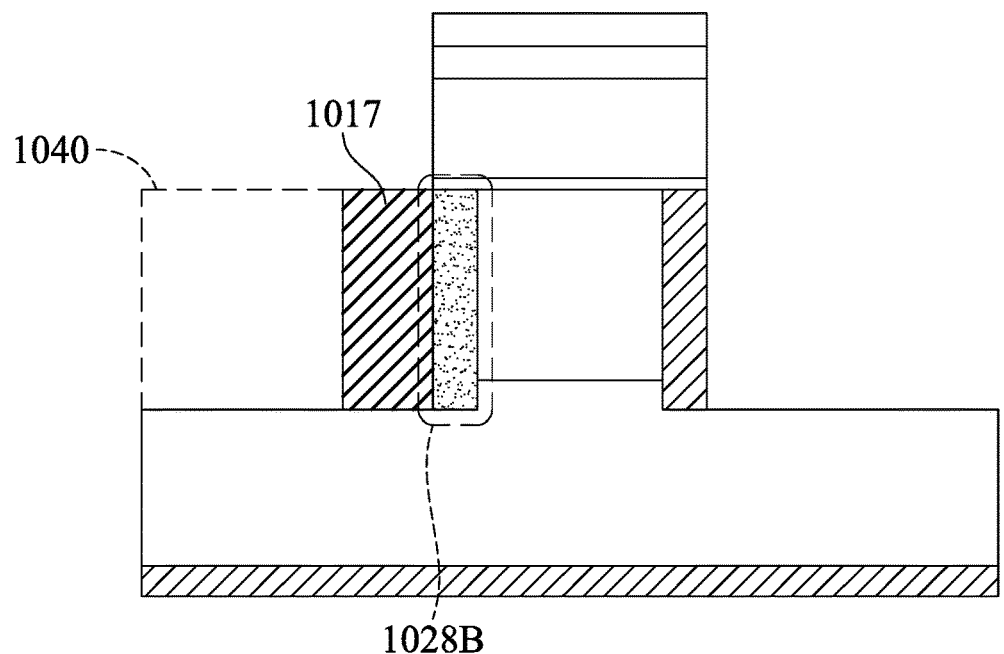

In an alternative embodiment, as shown for example in FIG. 10B, a trench 1015 may be formed in insulating region 908B followed by deposition of an insulating spacing layer 1017 as shown in FIG. 10C. Insulating spacing layer 1017 may be formed from various materials and may contain sublayers. In an illustrative embodiment depicted in FIG. 10C, regions 1027 and 1028B are adjacent to insulating spacing layer 1017. In an illustrative embodiment, layer 1017 may be formed from high etch selectivity material relative to the material forming regions 1027 and 1028B. In an example embodiment, depicted in FIG. 10D, material forming region 1027, as shown in FIG. 10C, may be removed resulting in recess region 1040. Recess region 1040 may be formed, for example, by etching material of region 1027 using various known etching techniques. For example, a buffered oxide etching (BOE) may be performed, to remove material forming region 1027. FIG. 10D shows insulating spacing layer 1017 and region 1028B that are the same as layer 1017 and region 1028B shown in FIG. 10C.

Figure 11A:
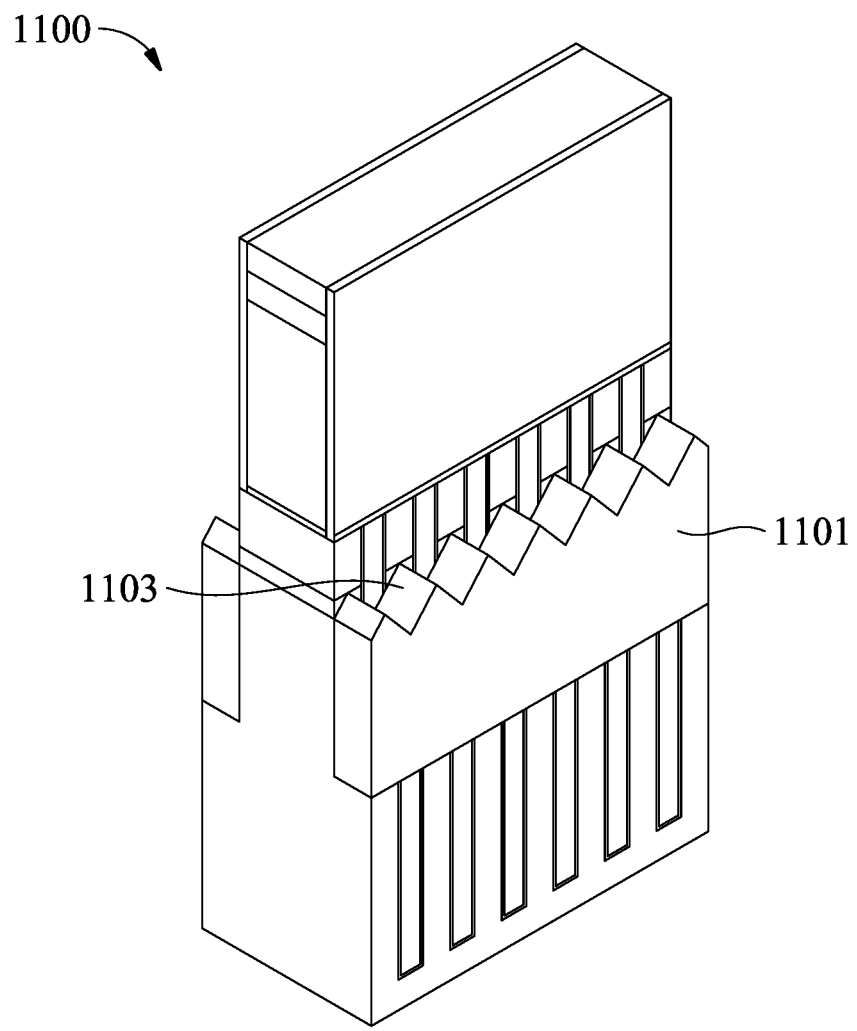
Figure 11B:
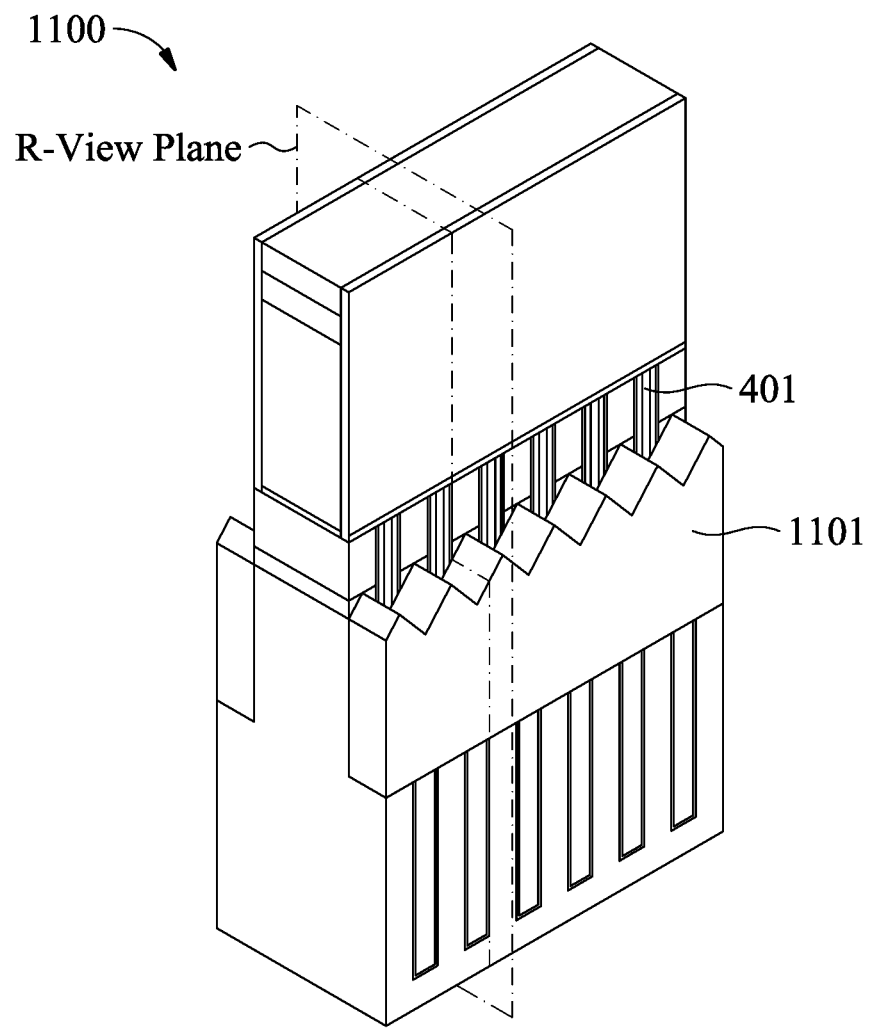
Figure 11C:
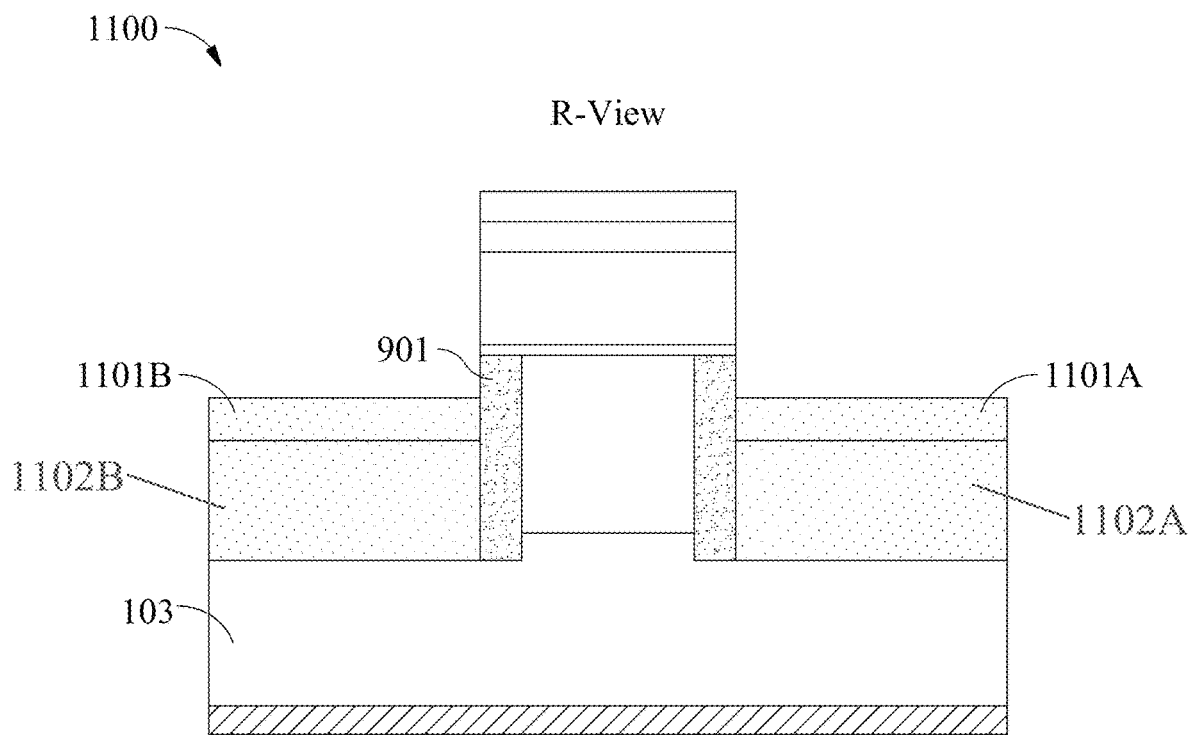

Following a step of depositing insulating layers 901, as shown for example in FIG. 9A, source/drain regions 1101 may be formed in source/drain recess regions 710 (e.g., as shown in FIG. 7C) as illustrated in FIG. 11A. FIG. 11C shows an R-View of structure 1100 at a cross-sectional plane depicted in FIG. 11B according to an illustrative embodiment. Source/drain regions 1101A and 1101B may be epitaxially grown over source/drain layers 1102A and 1102B and over fins 103 adjacent to insulating layers 901. In various embodiments source/drain regions 1101 may partially or completely fill source/drain recesses regions 710.

Source/drain regions 1101 may be formed from any suitable material, such as SiGe, SiGeB, Ge, GeSn, or the like. Epitaxial source/drain regions 1101 may have surfaces raised from respective surfaces of fins 103 and may have facets 1103 as shown in FIG. 11A. Epitaxial source/drain regions 1101 and/or fins 103 may be implanted with dopants. For instance, when structure 100 is used in the fabrication of nMOS FinFETs, n-type impurities may be implanted and may include phosphorus, arsenic, or the like. For fabrication of pMOS FinFETs p-type impurities may be implanted and may include boron gallium or the like. After the implantation of impurities, an annealing step may be performed to activate the p-type or n-type impurities. The source/drain regions may have an impurity concentration of between about $10^{19}$ cm$^{-3}$ and about $10^{21}$ cm$^{-3}$. In some embodiments, impurities may be introduced in source/drain regions 1101 during in situ doped epitaxial growth. In some embodiments, to remove damage on surfaces of source/drain regions 1101, an oxidation process may be performed. During the oxidation process, the damaged portions may react with oxygen forming oxide layers. The oxide layers may subsequently be removed by use of etching, such as wet etching.

Figure 11D:
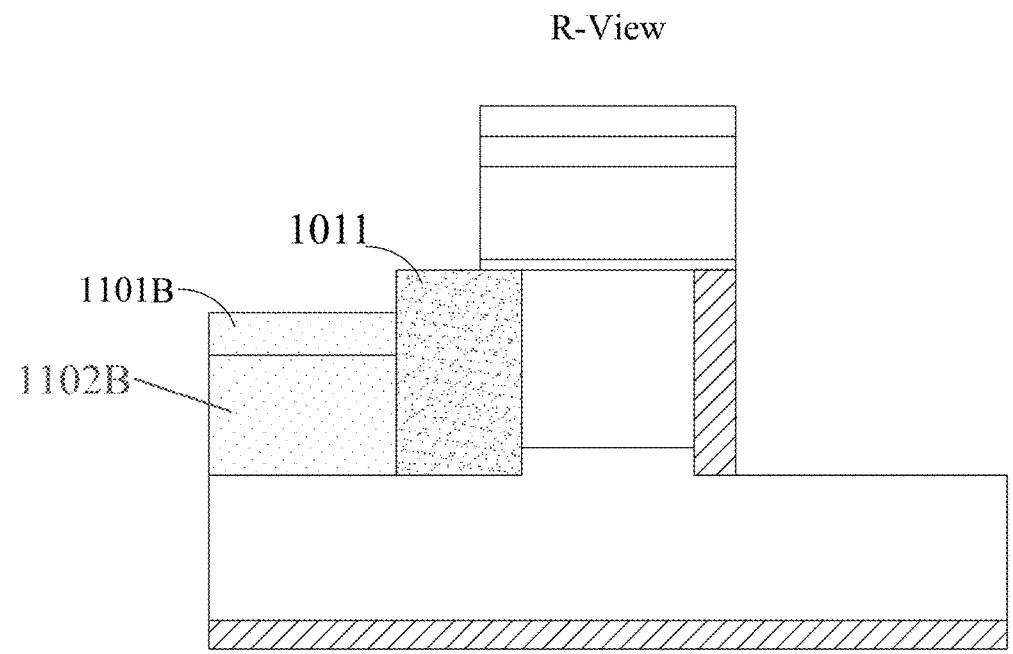
Figure 11E:
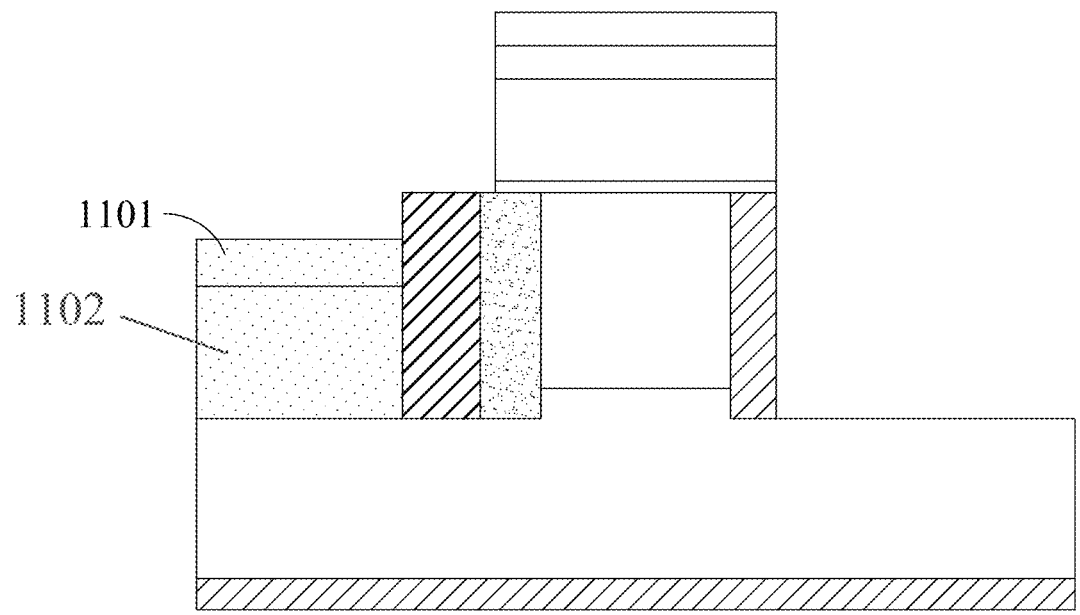

FIG. 11D shows an illustrative embodiment of source/drain region 1101B and source/drain layer 1102 forming in source/drain recess region 1010 adjacent to region 1011, as shown in FIG. 10A. Similarly, FIG. 11E shows forming of source/drain region 1101 and source/drain layer 1102 in recess region 1040 (recess region 1040 is shown in FIG. 10D).

Figure 12A:
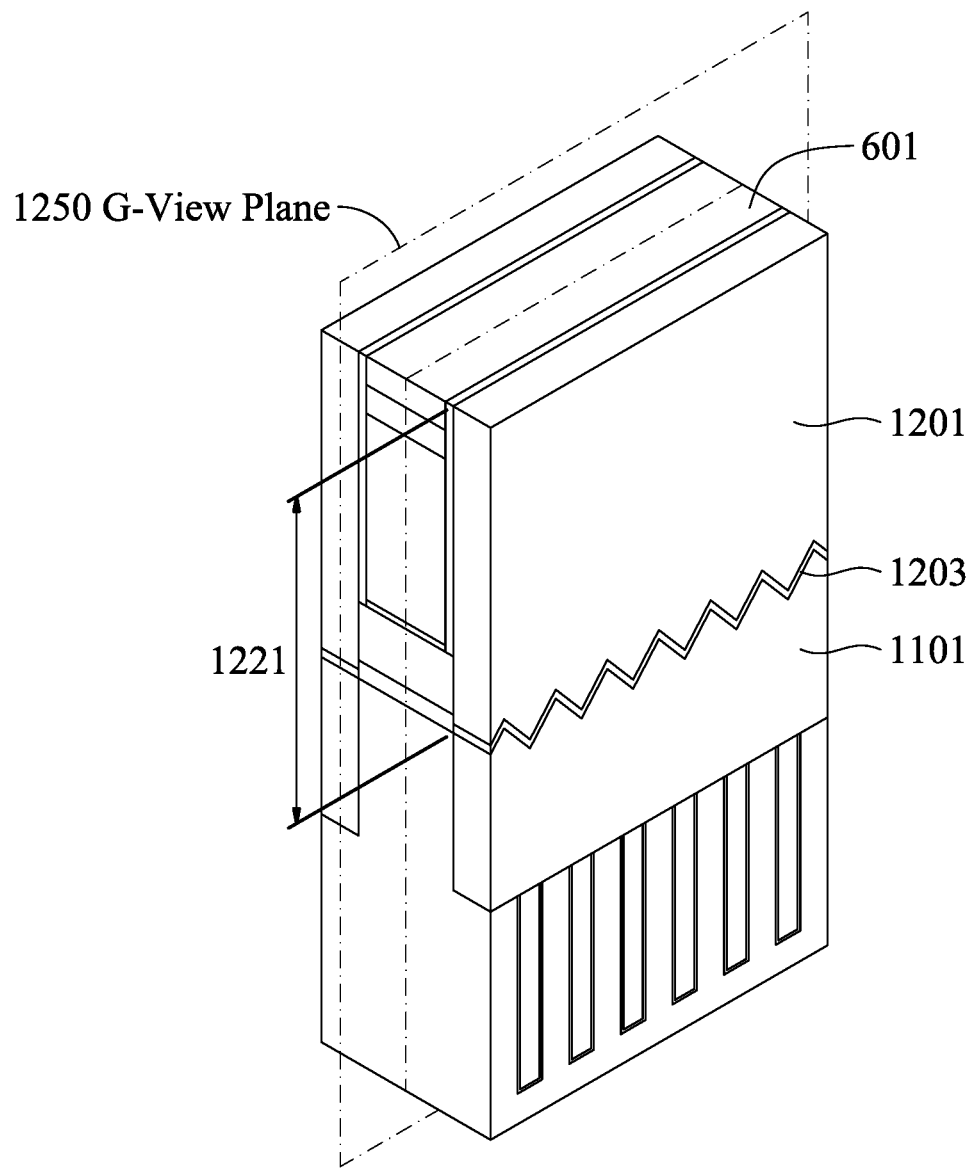

Following a step of depositing source/drain regions 1101, an interlayer dielectric (ILD) layers 1201 may be formed over source/drain regions 1101, as illustrated in FIG. 12A. In various embodiments, ILD layer 1201 may be adjacent to top layer 601 as shown in FIG. 12A. ILD layers 1201 may be formed of a dielectric material such as oxide (e.g., silicon oxide), nitride (e.g., silicon nitride), phospho-silicate glass (PSG), boro-silicate glass (BSG), boron-doped phospho-silicate glass (BPSG), undoped silicate glass (USG), or the like. Layers 1201 may be deposited by any suitable method, such as CVD, PECVD, or ALD. The height of void 1221 of ILD layer 1201 may be from 1 nm to 500 nm, although lesser and greater thicknesses may be used. ILD layer 1201 may be subsequently planarized using CMP. In some embodiments, a liner 1203 such as silicon nitride may be formed upon a portion of a surface of source/drain region 1101 and ILD layer 1201.

Figure 12B:
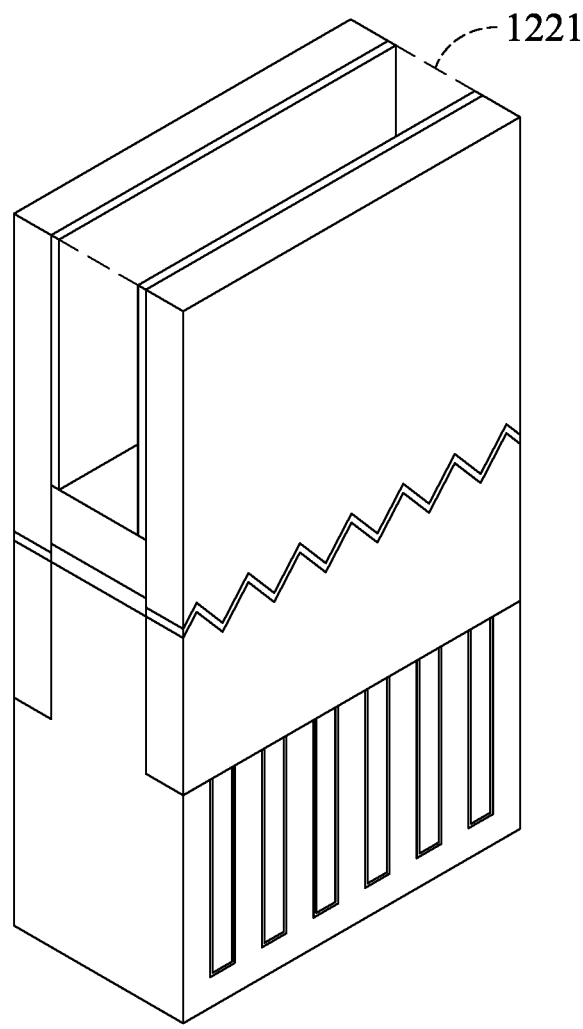
Figure 12C:
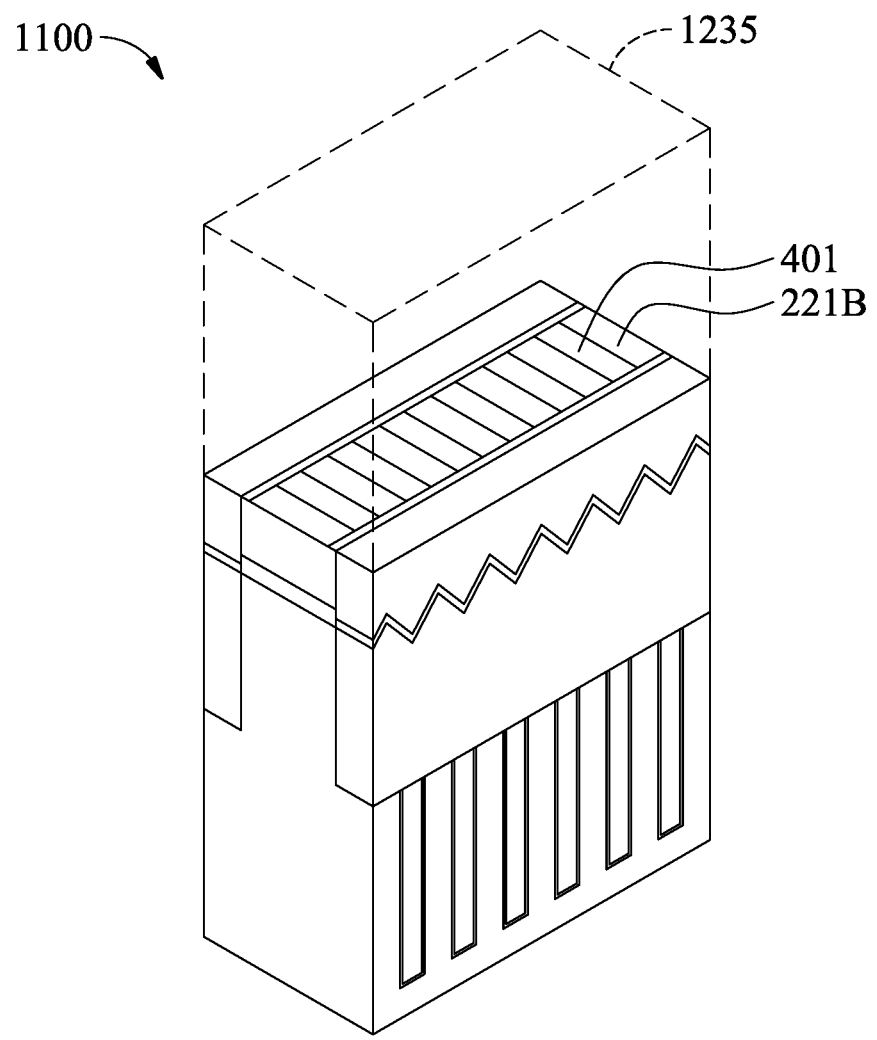

Following a step of forming ILD layers 1201, top layer 601 may be removed forming a void 1221, as illustrated in FIG. 12B or a void 1235 as shown in FIG. 12C. During the removal of top layer 601, the insulating layer 501, as shown in FIG. 5A may be used as an etch stop layer. Top layer 601 may be etched using any known solution such as wet etch, dry (plasma) etch, and/or other processes. For example, a dry etching process may use chlorine-containing gases, fluorine-containing gases, other etching gases, or a combination thereof. The wet etching solutions may include NH$_4$OH, HF (hydrofluoric acid) or diluted HF, deionized water, TMAH (tetramethylammonium hydroxide), other suitable wet etching solutions, or combinations thereof. Alternatively, as shown in FIG. 12C, top layer 601 and portions of ILD layers 1201, may be removed forming void 1235 through a planarization process such as a CMP to level the top surface of ILD layer 1201 with the top surface of layers 221B and a top surface of filled region 401. Void 1235, depicted in FIG. 12C corresponds to a region of the removed material. Removal of top layer 601 and portions of ILD layers 1201 result in a structure 1200 shown in FIG. 12C.

Figure 13A:
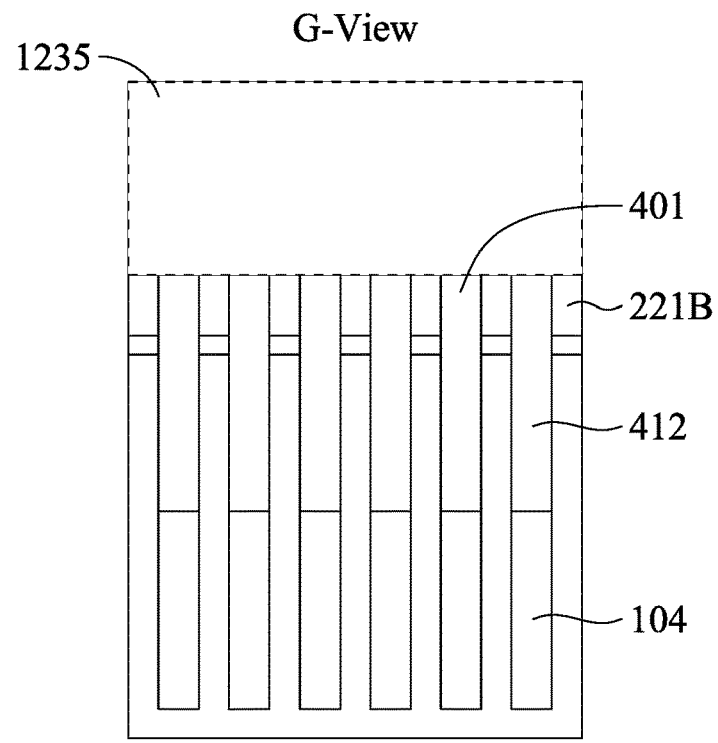
Figure 13B:
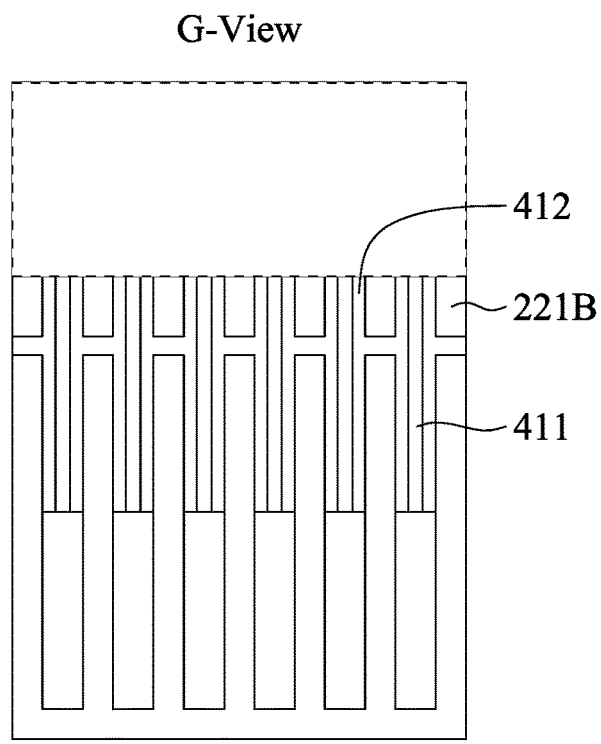

FIG. 13A shows a G-view of filled semiconductor structure 1200 along plane 1250 depicted in FIG. 12A, with top layer 601 and portion of ILD layers 1201 removed. FIG. 13A shows a cross-sectional view of filled region 401 with filler material 412, void 1235 of removed material, layer 221B, and isolation region 104, as shown in FIG. 1A. FIG. 13B shows a G-view of filled semiconductor structure 1200 with filled region 401 containing insulating layer 411 adjacent to filler material 412, as well as layer 221B, first shown, in FIG. 2A.

Figure 14A:
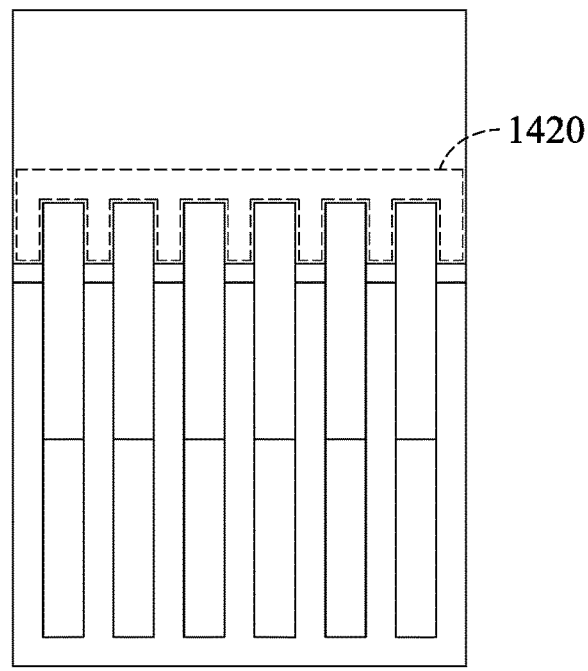
Figure 14B:
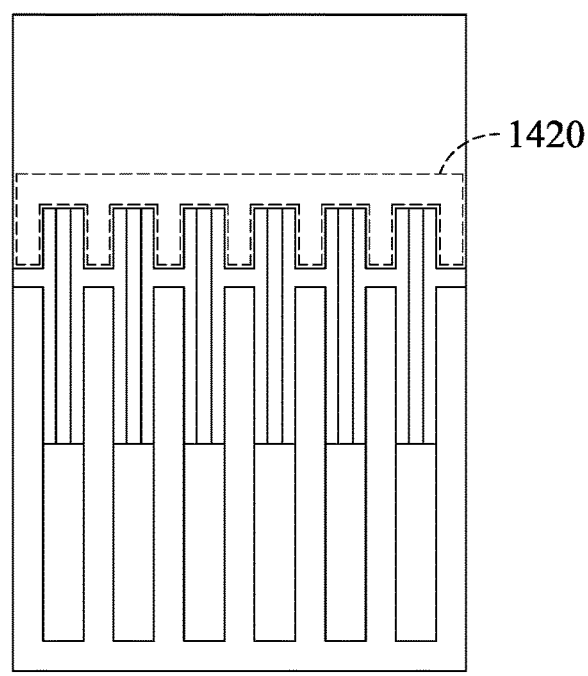
Figure 15A:
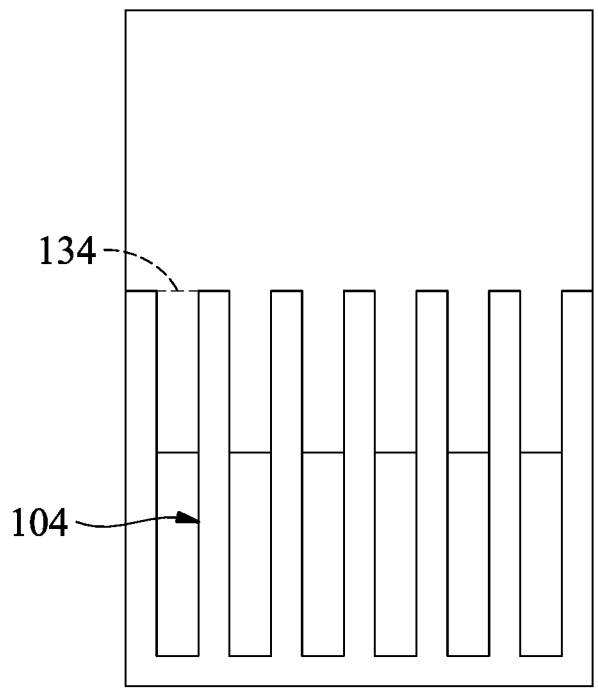
Figure 15B:
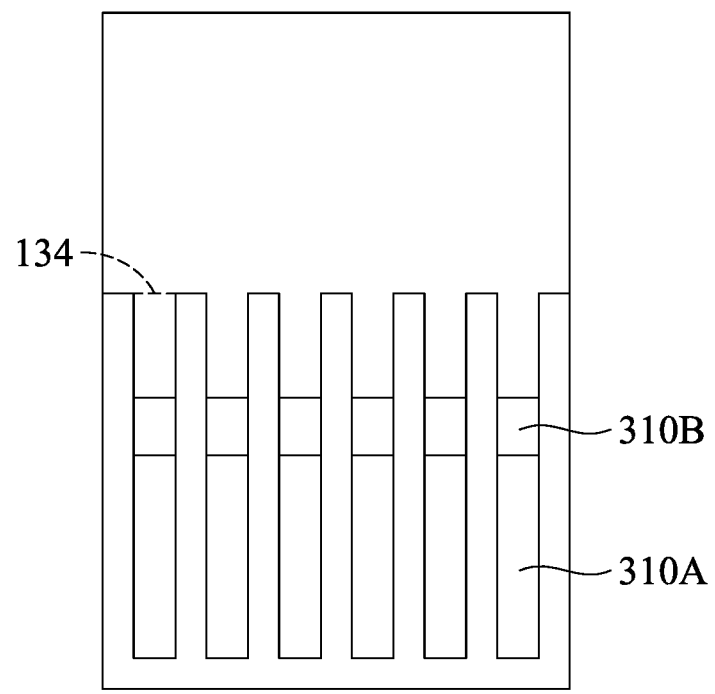

Following a step of removing top layer 601, filler material forming filled region 401 may be removed. Removing filler region 401 may include several sub-steps. FIGS. 14A and 14B show a first sub-step of removing layer 221B, as previously shown, for example, in FIGS. 13A and 13B, from structure 1200 resulting in recess 1420. In a following next sub-step, filler material 412 forming filled region 401 may be removed via etching resulting in partially exposing or re-exposing fin recess region 134 shown in FIG. 15A, where the term "exposing" or "re-exposing" refers to restoring fin recess region 134 to a state of fin recess region 134 prior to formation of filled region 401. The phrase "partially exposing" or "partially re-exposing" refers to the fact that fin recess region 134 is modified by etching a portion of structure 400 and removing filled region 401, as shown in FIG. 13A. Region 134 exposes a channel region of a respective epitaxial fin. Each channel region is disposed between neighboring pairs of epitaxial source/drain regions 1101. In an illustrative embodiment, during the etching of filler material 412 from region 401, as shown, for example, in FIG. 13A, the insulating layer 310B deposited over insulating layer 310A, as shown in FIG. 15B, may be used as an etch stop layer. In various embodiments, one or more etching processes may be selectively used to remove the filled region 401. The etching processes may include a suitable wet etch, dry (plasma) etch, and/or other processes. The etch process may depend on materials used to form filled region 401. For example, for filler material 412 being SiGe, a dry etching process may be used and may include chlorine-containing gases, fluorine-containing gases, other etching gases, or a combination thereof. During dry etching, RIE, NBE, cryogenic deep RIE using SF$_6$/O$_2$ plasma may be used for anisotropic etching. In some embodiments, when filled region 401 contains several filler materials (e.g., filler materials 412 and 411 depicted in FIG. 4B), wet and dry etching may be used. For example, for insulating filler material 411, wet etching may be used. The wet etching solutions may include NH$_4$OH, HF (hydrofluoric acid) or diluted HF, deionized water, TMAH (tetramethylammonium hydroxide), other suitable wet etching solutions, or combinations thereof. The wet etching may be followed by dry etching as described above.

Figure 16:
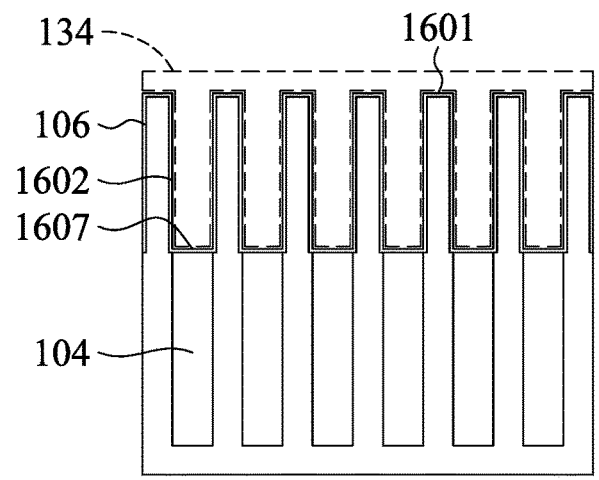
Figure 17:
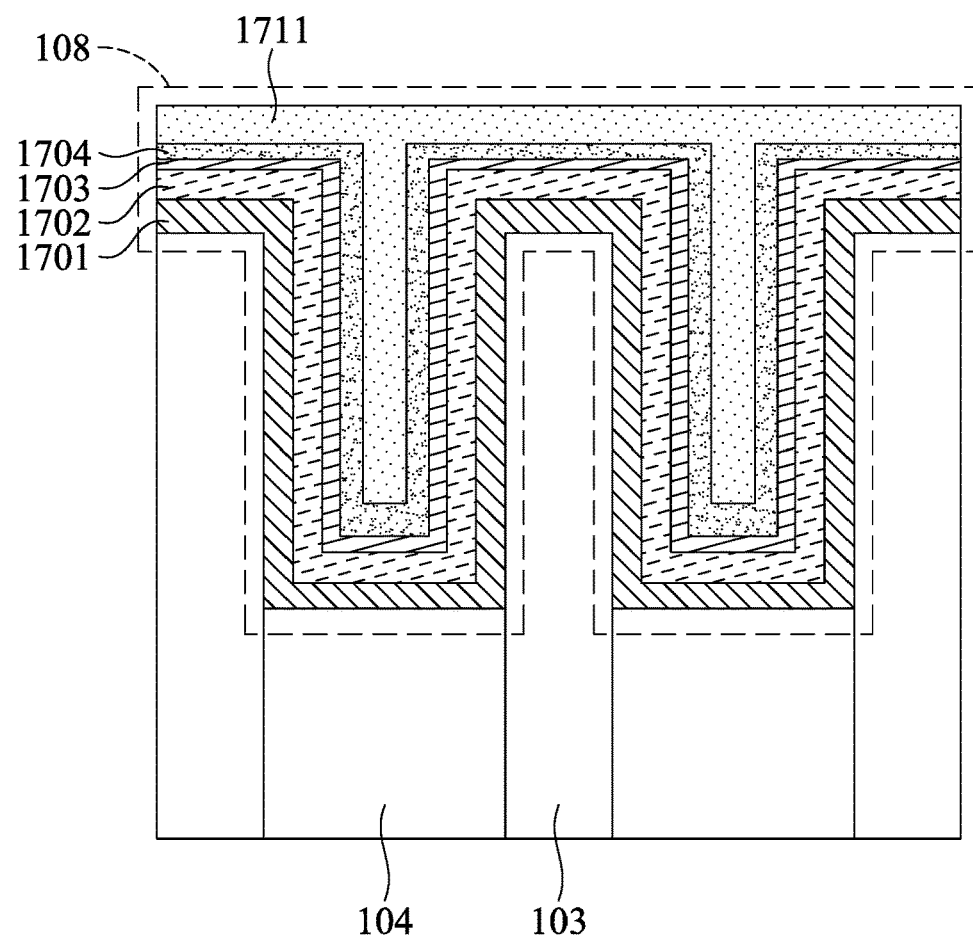

Following a step of removing filler material 412 from region 401, a gate dielectric layer 106 may be deposited, as illustrated in FIGS. 16 and 17. Gate dielectric layer 106 may be deposited in fin recess region 134 adjacent to fins 103. For example, FIG. 16 shows gate dielectric layer 106 deposited conformally in recess region 134 adjacent to top surfaces 1601 and sidewall surfaces 1602 of epitaxial fins 103 and a top surface 1607 of isolation region 104. In accordance with some embodiments, gate dielectric layer 106 may be formed from silicon oxide, silicon nitride, or multilayers thereof. In some embodiments, gate dielectric layer 106 may be formed from a high-k dielectric material. For example, layer 106 may include a metal oxide or a silicate of Hf, Al, Zr, La, Mg, Ba, Ti, Pb, and combinations thereof. The formation methods of layer 106 may include Molecular-Beam Deposition (MBD), Atomic Layer Deposition (ALD), PECVD, and the like.

In some embodiments, gate dielectric layer 106 may include a structure with multiple sublayers. For example, layer 106 may include a first sublayer adjacent to fins 103. In an illustrative embodiment, an interfacial sublayer 1701 may be adjacent to fins 103 as shown in FIG. 17. Interfacial sublayer 1701 may include a dielectric material such as silicon oxide layer (SiO$_2$) or silicon oxynitride (SiON) and may be formed by chemical oxidation, thermal oxidation, atomic layer deposition (ALD), CVD, and/or another suitable dielectric. In an illustrative embodiment, interfacial sublayer 1701 may be followed by a dielectric sublayer 1702 formed from a high-k dielectric material such as hafnium oxide (HfO$_2$), Al$_2$O$_3$, lanthanide oxides, TiO$_2$, HfZrO, Ta$_2$O$_3$, HfSiO$_4$, ZrO$_2$, ZrSiO$_2$, combinations thereof, or other suitable material. Dielectric sublayer 1702 may be formed by ALD and/or other suitable methods. Dielectric sublayer 1702 may be followed by a barrier sublayer 1703 intended to protect dielectric sublayer 1702 from metal impurities due to deposition of gate structure 108 containing metal. In various embodiments, barrier sublayer 1703 may include a metal element. For example, barrier sublayer 1703 may include tantalum nitride, titanium nitride, niobium nitride or the like. In an example embodiment, barrier sublayer 1703 is formed by ALD, PVD, CVD, or other suitable methods and may have a thickness of about few angstroms to few nanometers. The thickness and the material of barrier sublayer 1703 may be chosen to reduce or prevent diffusion of metal used to form gate structure 108 into dielectric sublayer 1702 and interfacial sublayer 1701. In various embodiments of the present disclosure, another sublayer may be further used to form gate dielectric layer 106. For example, dielectric sublayer 1702 formed from high-k dielectric materials may include several sublayers of different high-k dielectric material. Similarly, barrier layer 1703 may include several sublayers that may be formed from metal-nitride and metal-oxide materials such as tantalum nitride, titanium nitride, tantalum oxide, and titanium oxide. Other oxide and nitride materials may be deposited using various known approaches.

Figure 18:
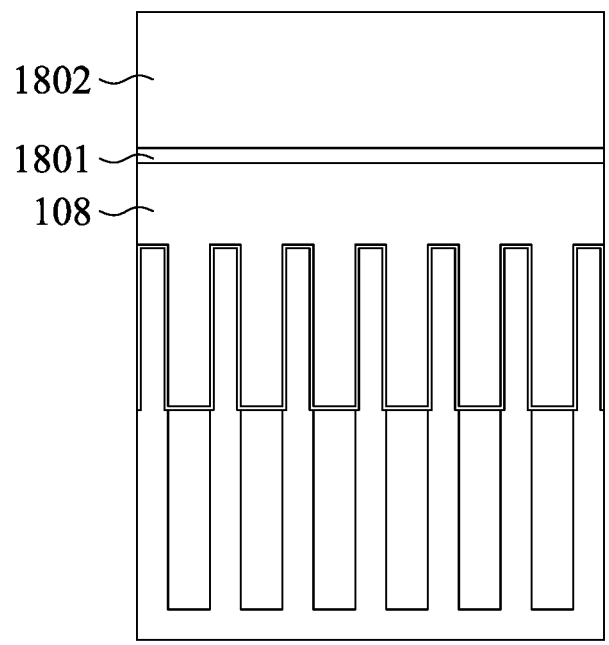

Following a step of forming gate dielectric layer 106 a gate structure 108 may be deposited, as illustrated in FIGS. 17 and 18. FIG. 17 illustrates a metal layer 1704 that may be deposited over gate dielectric layer 106. Metal layer 1704 may be formed from a metal with selected work function. The work function of metal layer 1704 may be a p-type or an n-type work function. Exemplary metals with p-type work function include TiN, TaN, Ru, Mo, Al, WN, ZrSi$_2$, MoSi$_2$, TaSi$_2$, NiSi$_2$, WN, other suitable p-type work function materials, or combinations thereof. These metals may be used for formation of pMOS FinFETs. Exemplary metals with n-type work function include Ti, Ag, TaAl, TaAlC, TiAlN, TaC, TaCN, TaSiN, Mn, Zr, other suitable n-type work function materials, or combinations thereof. These metals may be used for formation of nMOS FinFETs. Metal layer 1704 may include a plurality of layers and may be deposited by CVD, PVD, and/or another suitable process.

Following the deposition of metal layer 1704, a metal gate electrode material forming a region 1711 depicted in FIG. 17 may be deposited in remaining spaces to complete gate structure 108. Region 1711 may include aluminum, tungsten, cobalt, copper, and/or other suitable materials. Region 1711 may be formed by CVD, PVD, plating, and/or other suitable processes. A CMP process may be performed to remove excess materials so as to planarize a top surface of gate structure 108 and finalize the formation of gate structure 108.

In various embodiments, a top conductive layer 1801 illustrated in FIG. 18 may be formed over gate structure 108. Top conductive layer 1801 may protect gate structure 108 from various subsequent processes, such as etching, annealing, or the like. Top conductive layer 1801 may, for example, include tungsten. In various embodiments, an insulating layer 1802 (also referred to as self-aligning layer) may be deposited over a top conductive layer 1801. Insulating layer 1802 may prevent the formation of an electrical connection between source/drain and a gate region, and may include low-k material (e.g., a material with dielectric constant less than 15). In some embodiments, layer 1802 may include SiN, $SiO_2$, $HFO_2$, ZnO, ZrN, and/or the like.

Figure 19:
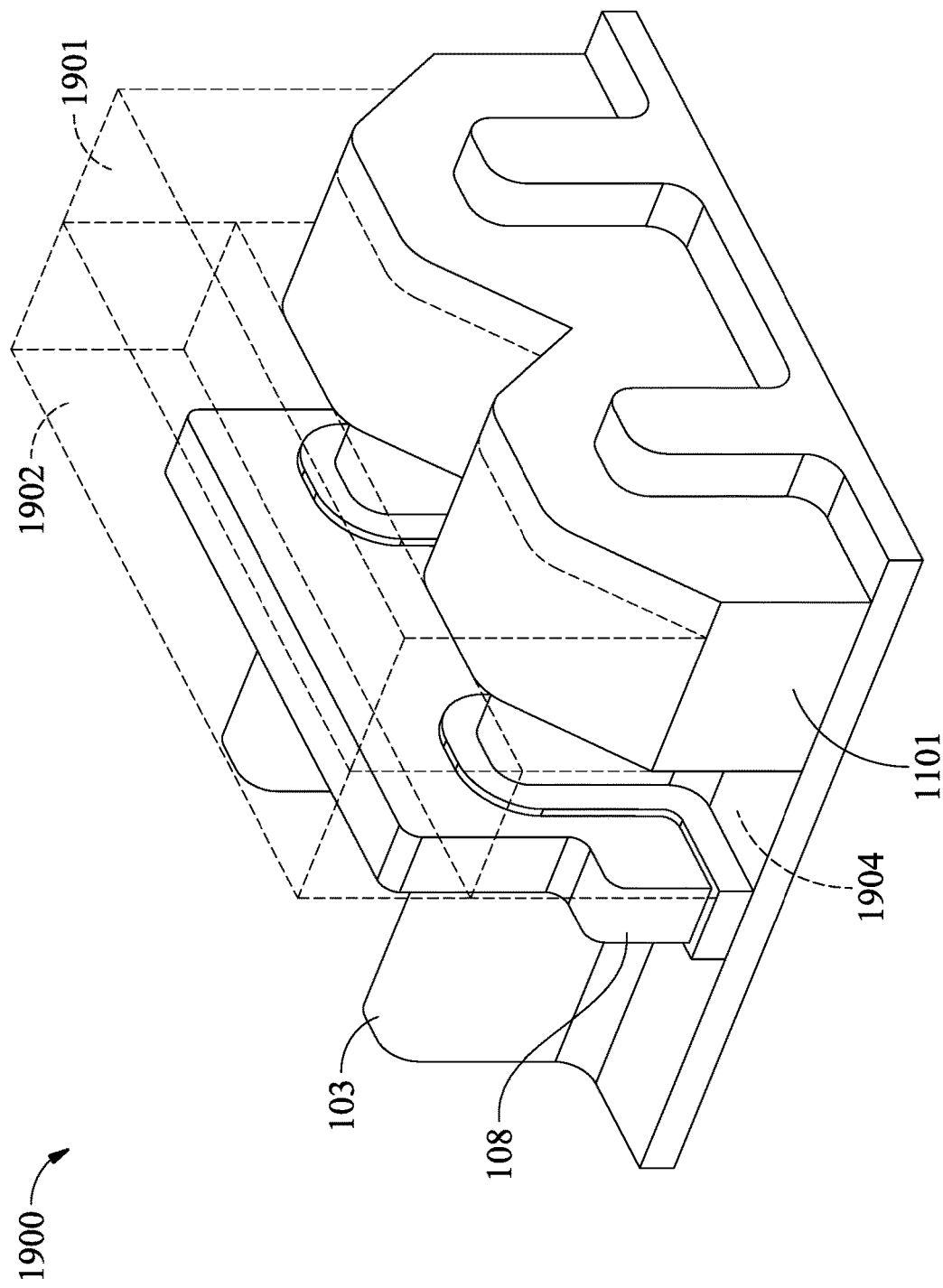

Semiconductor structure 100 depicted in FIG. 1A may be used for fabrication of semiconductor devices such as FinFETs. For fabrication of FinFET device, the structure may further include a source/drain contact to source/drain regions 1101. The source/drain contact may include a conductive material (e.g., a metal, such as tungsten, polysilicon or a metal-containing material). In various embodiments, the ILD layers may be deposited over the source/drain region. For example, FIG. 19 shows a structure 1900 containing ILD layer 1901 deposited over source/drain region 1101 that is formed over fins 103. Structure 1900 may contain a spacer layer 1904 deposited between gate structure 108 and source/drain region 1101. In various embodiments, spacer layer 1904 may, for example, include several dielectric layers. Spacer 1904 may be formed from silicon oxide, hafnium oxide, silicon nitride, or the like. Further, structure 1900 may contain ILD layer 1902 deposited over a spacer layer 1904. ILD layers 1901 and 1902 may be planarized at the upper surface of ILD layers. In some embodiments, source/drain contacts may be protected by a liner material at the interface of source/drain 1101 and ILD layer 1901. The liner material may be, for example, titanium nitride. In some embodiments, a silicide layer (not shown) may be formed upon source/drain region 1101.

Figure 20:
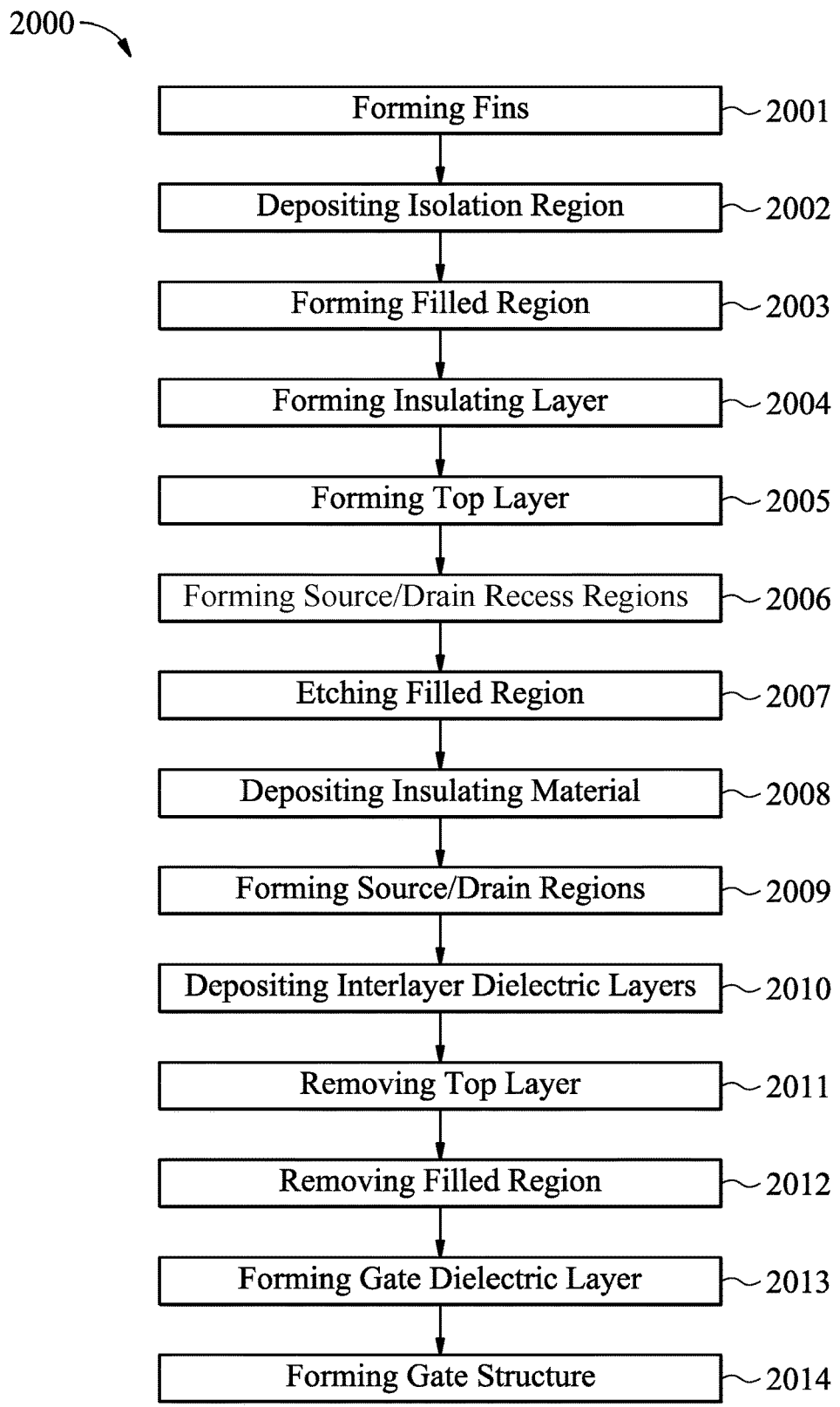
FIG. 20 is a flow-chart of a process consistent with various illustrative embodiments.

In various embodiments, a process 2000 for forming various described semiconductor structures may be provided, as illustrated in FIG. 20. At step 2001 of process 2000, the fins may be formed over semiconductor substrate 102 (as shown in FIG. 1A, for example), At step 2002 isolation regions may be deposited as illustrated in FIG. 2B, for example, and at step 2003 a region between fins may be filled as shown for example in FIG. 4A or 4B. At step 2004, insulating layer 501 may be formed as illustrated in FIG. 5A, and at step 2005, a top layer 601 may be deposited over a portion of surface 503 as shown in FIG. 6A. At step 2006, source/drain recess regions 710 may be formed as illustrated in FIG. 7A, and at step 2007, filled region 401 may be partially etched as illustrated in FIG. 8A. At step 2008, insulating layers 901 may be deposited in front and back trenches 825 as illustrated in FIG. 9A, and in step 2009, source/drain regions, 1101 may be formed in source/drain recess regions 710 as illustrated in FIG. 11A. At step 2010, ILD layers 1201 may be formed over source/drain regions 1101 as illustrated in FIG. 12, and at step 2011, top layer 601 may be removed as illustrated in FIGS. 12B and 12C. At step 2012, filler material forming filled region 401 may be removed, and at step 2013 gate dielectric layer 106 may be deposited as illustrated in FIGS. 16 and 17. At step 2014 a gate structure 108 may be deposited as illustrated in FIGS. 17 and 18.

Figure 21:
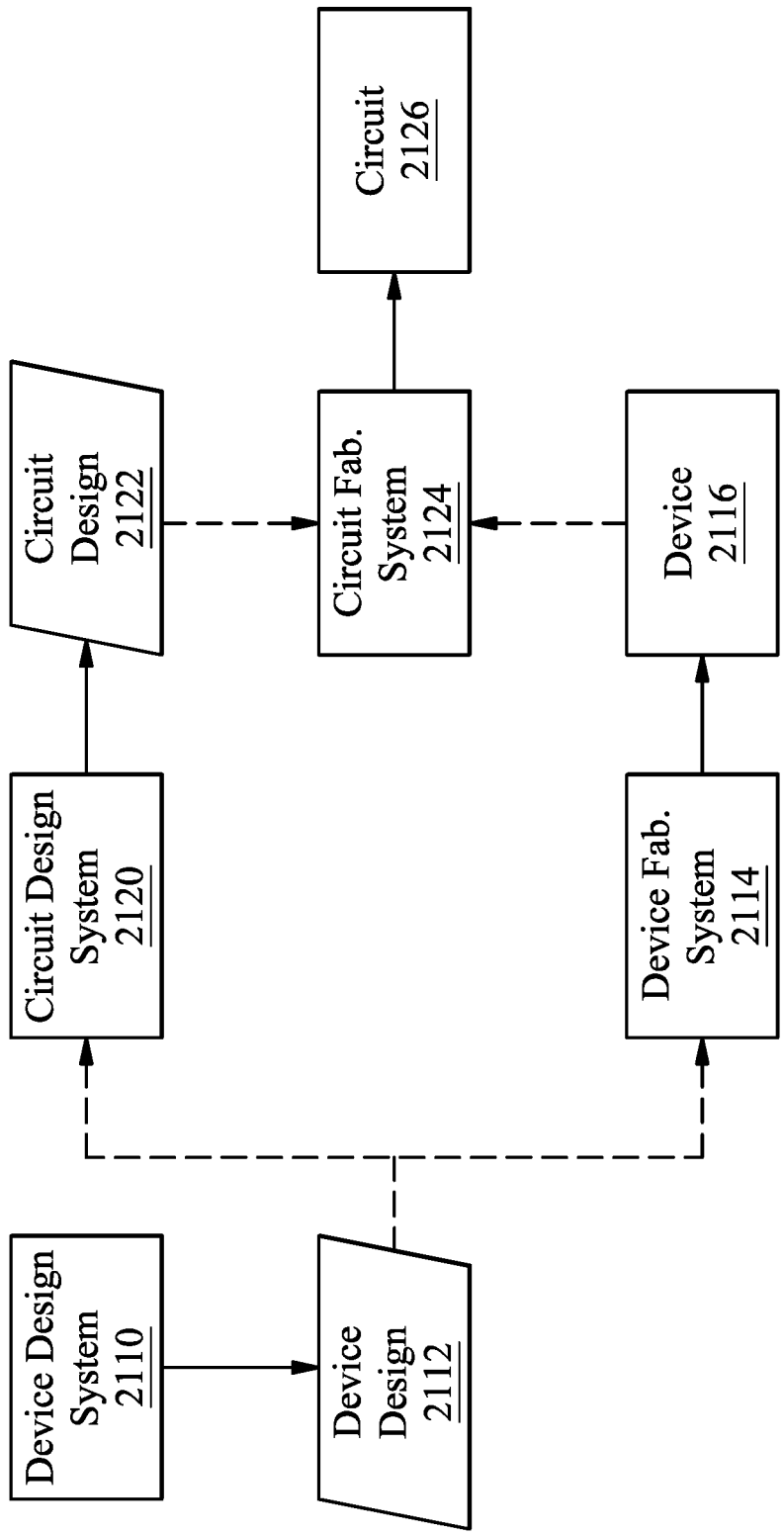
FIG. 21 is an illustrative flow diagram for fabrication process consistent with various illustrative embodiments.

The disclosed embodiments include a method of designing and/or fabricating a circuit that includes one or more of the devices designed and fabricated based on various structures as described herein (e.g., including one or more devices fabricated using a semiconductor structure described herein). To this extent, FIG. 21 shows an illustrative flow diagram for fabricating a circuit 2126 according to an embodiment. Initially, a user can utilize a device design system 2110 to generate a device design 2112 for a semiconductor device containing semiconductor structure 100 as described herein. The device design 2112 can comprise program code, which can be used by a device fabrication system 2114 to generate a set of physical devices 2116 containing semiconductor structure 100 according to the features defined by the device design 2112. Similarly, the device design 2112 can be provided to a circuit design system 2120 (e.g., as an available component for use in circuits), which a user can utilize to generate a circuit design 2122 (e.g., by connecting one or more inputs and outputs to various devices included in a circuit). The circuit design 2122 can comprise program code that includes a device designed as described herein. In any event, the circuit design 2122 and/or one or more physical devices 2116 can be provided to a circuit fabrication system 2124, which can generate a physical circuit 2126 according to the circuit design 2122. The physical circuit 2126 can include one or more devices 2116 containing semiconductor structure 100 designed as described herein.

The disclosed embodiments provide a device design system 2110 for designing and/or a device fabrication system 2114 for fabricating a semiconductor device 2116 containing semiconductor structure 100 as described herein. In this case, the system 2110 and 2114 can comprise a computing device, which is specifically programmed to implement a method of designing and/or fabricating the semiconductor device 2116 containing semiconductor structure 100 as described herein. Similarly, various embodiments provide a circuit design system 2120 for designing and/or a circuit fabrication system 2124 for fabricating a circuit 2126 that includes at least one device 2116 containing semiconductor structure 100 designed and/or fabricated as described herein. In this case, the system 2120, 2124 can comprise a computing device, which is specifically programmed to implement a method of designing and/or fabricating the circuit 2126 including at least one semiconductor device 1016 containing semiconductor structure 100 as described herein.

In some cases, the disclosed embodiments may include a computer program fixed in at least one computer-readable medium, which when executed, enables a computer system to implement a method of designing and/or fabricating a semiconductor device containing semiconductor structure 100 as described herein. For example, the computer program can enable the device design system 2110 to generate the device design 2112 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In some cases, the disclosed embodiments may include a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, various embodiments provide a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In some cases, the disclosed embodiments may include a method of generating a device design system 2110 for designing and/or a device fabrication system 2114 for fabricating a semiconductor device containing semiconductor structure 100 as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The exemplary methods and techniques described herein may be used in the fabrication of integrated circuit chips. The resulting integrated circuit chips can be distributed by the fabricator in raw wafer form (i.e., as a single wafer that has multiple unpackaged chips), as a bare die, or in a packaged form. In the latter case, the chip is mounted in a single chip package (e.g., a plastic carrier, with leads that are affixed to a motherboard) or in a multichip package (e.g., a ceramic carrier that has either or both surface interconnections or buried interconnections). The chip is then integrated with other chips, discrete circuit elements and/or other signal processing devices as part of either (a) an intermediate product, such as a motherboard, or (b) an end product. The end product can be any product that includes integrated circuit chips, ranging from toys and other low-end applications to advanced computer products having numerous components, such as a display, a keyboard or other input device and/or a central processor, as non-limiting examples. Unless described otherwise or in addition to that described herein, "depositing" may include any now known or later developed techniques appropriate for the material to be deposited, including, but not limited to: CVD, LPCVD, PECVD, semi-atmosphere CVD (SACVD), high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic level deposition (ALD), chemical oxidation, molecular beam epitaxy (MBE), plating or evaporation.

Unless described otherwise or in addition to that described herein, "etching" may include any now known or later developed techniques appropriate for removal of material, including, but not limited to dry etching processes (e.g., plasma etching, plasma-less gas etching, sputter etching, ion milling, reactive ion etching (RIE)) or wet etching processes (e.g., applying an acid, base, or solvent to dissolve part of the structure, or an abrasive formulation to polish away part of the structure).

The exemplary methods and structures described herein are used to fabricate a semiconductor structure with a metal gate. Such semiconductor structure may be used to form FinFETs and similar devices. In various embodiments, the semiconductor structure is formed by first fabricating fins over a semiconductor substrate. Fins may be fabricated by a process of etching the semiconductor substrate, by epitaxial growth, or by a combination of etching and the epitaxial grown. In various embodiments, several fins are formed over the semiconductor substrate. In various embodiments, a filler material is epitaxially grown in a region between the fins. In some embodiments, the filler material may include SiGe. Following the epitaxial growth of the filler material, a top layer may be deposited over a filled semiconductor structure, and a source and a drain recess may be formed. A source and a drain region may then be deposited into the source and the drain recess. In various embodiments, the top layer may be removed followed by removal of the filler material between the fins. Following removal of the filler material, the gate structure may be deposited into the region between the fins. In various embodiments, the gate structure includes dielectric and metallic layers. In various embodiments, in the regions between the fins, the gate structure is isolated from the source and the drain region by an insulating layer.

Consistent with a disclosed embodiment, a method of fabricating a semiconductor structure including a semiconductor substrate containing fins separated by a fin recess region is provided. The method may include filling the fin recess region with a first material resulting in a filled semiconductor structure; forming a top layer over a first portion of the filled semiconductor; and etching a source recess region and a drain recess region from a second portion of the filled semiconductor structure. Further, the method may include laterally etching a portion of the first material from a front and a back sidewall of the first portion exposed by the source and drain recess regions resulting in a front and a back sidewall trench; depositing a second material into the front and the back sidewall trench; and forming a source region in the source recess region and forming a drain region in the drain recess region. Further, the method may include removing the top layer to expose a top surface of the first portion; removing the first material, and partially re-exposing the fin recess region; depositing a gate dielectric layer conformal to a surface of the partially re-exposed fin recess region, and depositing a conductive material into a remaining portion of the fin recess region.

Consistent with another disclosed embodiment, a method of fabricating a semiconductor structure including a semiconductor substrate containing fins separated by a fin recess region is provided. The method may include depositing a first filler material forming a conformal layer to a surface of the fin recess region; depositing a second filler material resulting in a filled semiconductor structure; forming a top layer over a first portion of the filled semiconductor structure, and etching a source recess region and a drain recess region from a second portion of the filled semiconductor structure. Further, the method may include laterally etching a portion of the first filler material from a front and a back sidewall of the first portion exposed by the source and drain recess regions resulting in a front and a back trench; depositing a second material into the front and the back sidewall trench; forming a source region in the source recess region and a drain region in the drain recess region. Further, the method may include removing the top layer to expose a top surface of the first portion; removing the first and the second filler material, and partially re-exposing the fin recess region; depositing a gate dielectric layer conformal to a surface of the partially re-exposed fin recess region; and depositing a conductive material into a remaining portion of the fin recess region.

Consistent with another disclosed embodiment, a semiconductor structure includes a fin region extending from a semiconductor substrate, the fin region including at least a pair of fins. The pair of fins are separated by a filled region filled with a first material, where the first material has an etch rate that is higher than an etch rate of a material used to form at least one of the pair of fins. The first material is epitaxially grown to form a filled region, and the fin region includes a first and a second set of surfaces. The semiconductor structure also includes a source region and a drain region, the source region being adjacent to the first set of the surfaces of the fin region, and the drain region being adjacent to the second set of the surfaces of the fin region.

The accompanying figures and this description depict and describe various embodiments and features and components thereof. Those skilled in the art will appreciate that any particular nomenclature used in this description was merely for convenience, and thus various embodiments should not be limited by the specific process identified and/or implied by such nomenclature. Therefore, it is desired that the embodiments described herein be considered in all respects as illustrative, not restrictive, and that reference be made to the appended claims for determining the scope of various embodiments.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure and that they may make various changes, substitutions, and alterations herein without departing from the spirit and scope of the present disclosure.

What is claimed is:

1. A method of fabricating a semiconductor structure containing fins separated by a fin recess region, the method comprising:
   filling the fin recess region with a first material resulting in a filled semiconductor structure;
   forming a top layer over a first portion of the filled semiconductor structure;
   etching a source recess region and a drain recess region from a second portion of the filled semiconductor structure;
   laterally etching a portion of the first material from a front and a back sidewall of the first portion exposed by the source and drain recess regions resulting in a front and a back sidewall trench;
   depositing a second material into the front and the back sidewall trench;
   forming a source region in the source recess region and forming a drain region in the drain recess region;
   removing the top layer to expose a top surface of the first portion;
   removing the first material, and partially re-exposing the fin recess region;
   depositing a gate dielectric layer conformal to a surface of the partially re-exposed fin recess region; and
   depositing a conductive material into a remaining portion of the fin recess region.

2. The method of claim 1, further comprising depositing a protective mask over a top surface of the fins prior to filling the fin recess region with the first material.

3. The method of claim 1, wherein filling the fin recess region with the first material comprises epitaxial growth of the first material.

4. The method of claim 1, wherein the conductive material is a metal.

5. The method of claim 1, wherein the second material comprises a dielectric material.

6. The method of claim 1, wherein the second material comprises a high-k dielectric material.

7. The method of claim 1, further comprising a chemical-mechanical planarization prior to forming of the top layer.

8. The method of claim 1, wherein the top layer comprises polycrystalline silicon.

9. The method of claim 1 further comprising depositing an oxide material into the fin recess region and partially filling the fin recess region prior to filling the fin recess region with the first material.

10. The method of claim 9, wherein etching the source recess region and the drain recess region from the second portion of the filled semiconductor structure, comprises etching the second portion by at least a depth needed to expose the oxide material.

11. The method of claim 1, wherein forming the source region and the drain region comprises:
    forming a source layer and a drain layer; and
    forming an interlayer dielectric layer.

12. The method of claim 1, wherein forming the source and the drain region comprises epitaxial growth of a silicon containing semiconductor material.

13. The method of claim 1, wherein the second material comprised a dielectric material.

14. The method of claim 1, wherein a thickness of the second material is chosen to prevent electrical conduction between the conductive material and the source region, and between the conductive material and the drain region.

15. The method of claim 1, further comprising depositing a self-aligned layer over a top surface of the conductive material.

16. The method of claim 1, wherein etching the source recess region and the drain recess region comprises performing a reaction ion etch.

17. A method of fabricating a semiconductor structure containing fins separated by a fin recess region, the method comprising:
    depositing an insulation material forming a conformal layer to a surface of the fin recess region;
    depositing a filler material resulting in a filled semiconductor structure;
    forming a top layer over a first portion of the filled semiconductor structure;

etching a source recess region and a drain recess region from a second portion of the filled semiconductor structure;

laterally etching a portion of the filler material from a front and a back sidewall of the first portion exposed by the source and drain recess regions resulting in a front and a back sidewall trench;

depositing a second material into the front and the back sidewall trench;

forming a source region in the source recess region and a drain region in the drain recess region;

removing the top layer to expose a top surface of the first portion;

removing the filler material, and partially re-exposing the fin recess region;

depositing a gate dielectric layer conformal to a surface of the partially re-exposed fin recess region; and depositing a conductive material into a remaining portion of the fin recess region.

18. The method of claim 17, further comprising depositing a protective mask over a top surface of the fins prior to filling the fin recess region with the insulation material and the filler material.

19. The method of claim 17, wherein the filler material comprises an oxide material.

20. The method of claim 17, wherein etching the source recess region and the drain recess region comprises performing a reaction ion etch.

* * * * *